United States Patent
Noguchi

(10) Patent No.: US 7,005,931 B2
(45) Date of Patent: Feb. 28, 2006

(54) SEMICONDUCTOR INTEGRATED CIRCUIT

(75) Inventor: Hidekazu Noguchi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 159 days.

(21) Appl. No.: 10/772,390

(22) Filed: Feb. 6, 2004

(65) Prior Publication Data

US 2004/0257164 A1    Dec. 23, 2004

(30) Foreign Application Priority Data

Jun. 18, 2003   (JP) .............................. 2003-173003

(51) Int. Cl.
    *H03B 27/00* (2006.01)
(52) U.S. Cl. .................. 331/57; 331/176; 331/66; 331/175
(58) Field of Classification Search ................ 331/57, 331/176, 66, 175; 327/182
    See application file for complete search history.

(56) References Cited

U.S. PATENT DOCUMENTS 6,163,225 A * 12/2000 Sundaram et al. ............ 331/57
6,803,831 B1 * 10/2004 Nishikido ..................... 331/57

FOREIGN PATENT DOCUMENTS

JP       05-299982       11/1993
JP       05-307882       11/1993

* cited by examiner

*Primary Examiner*—Arnold Kinkhead
(74) *Attorney, Agent, or Firm*—Nixon Peabody LLP; Donald R. Studebaker

(57) ABSTRACT

An oscillator circuit having an oscillation period moderately varying such that it is short at high temperature but long at low temperature and wherein a maximum value of oscillation period at low temperature can be set. By coupling a resistance parallel circuit having a resistance element having a resistance value decreasing with increasing temperature and a resistance element having a resistance value nondependent upon temperature at between the main electrodes of PMOST and NMOST, the output signal of an inverter is caused to vary with temperature. A ring oscillator circuit outputs an oscillation period short at high temperature but long at low temperature. Meanwhile, because oscillation period is greatly affected by a resistance value of the resistant element not dependent upon temperature at low temperature, a maximum value of oscillation period can be set.

6 Claims, 21 Drawing Sheets

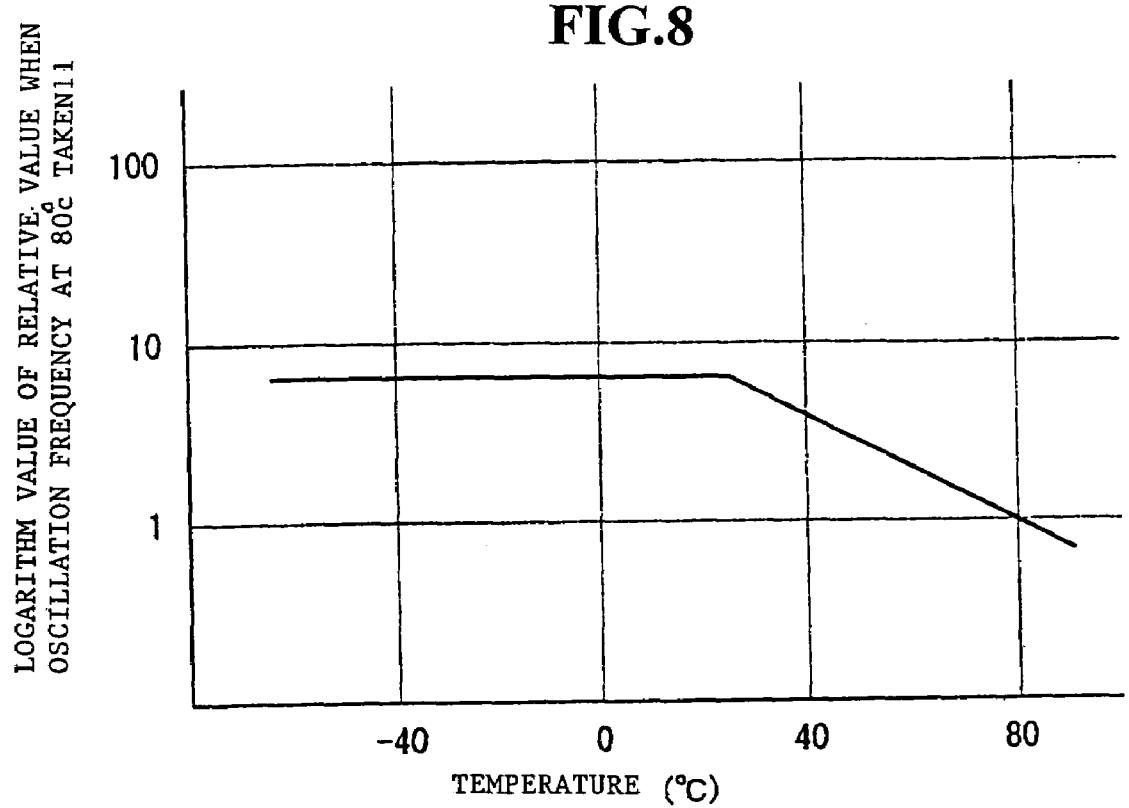

SEMICONDUCTOR INTEGRATED CIRCUIT

BACKGROUND OF THE INVENTION

1. Field of the Invention

This invention relates to semiconductor integrated circuits and, more particularly, to a circuit for outputting a signal with a constant period by means of an oscillator circuit or a frequency divider circuit connected to the oscillator circuit.

2. Description of the Related Art

Dynamic random access memories (DRAMs) are broadly used as cells (memory cells) for storing information. The DRAM, for holding information depending upon the presence or absence of storage charge on the capacitor, has a feature to gradually release the written charge and lose information as time elapses. In order to hold information at all times, there is a need to periodically read and rewrite the content on the memory cell. This operation is called refresh. On the DRAM, refresh is possible with external input. The refresh operation at a constant time interval eliminates the possibility of information erasure. Meanwhile, the DRAM has a self-refresh function to automatically make a refresh operation at a constant time interval by means of an internal timer.

The interval of refresh operation is determined by a discharge time of the charge written on the memory cell. Generally, discharge time is shorter at high temperature as compared to that at low temperature. For this reason, it is the conventional practice to set a refresh operation interval in self-refresh mode at a sufficiently short time not to erase information even at high temperature, thus making the refresh operation interval constant to a possible extent regardless of temperature. As a result, the interval of the refresh operation at low temperature can become unnecessarily short.

Recently, from the demand for the products reduced in power consumption, there is a need for an approach that the consumption power at low temperature is reduced by increasing the refresh interval.

For example, Japanese Patent Kokai No. 5-299982 (Patent Document 1), page 3, FIG. 1, discloses that a resistance element is provided in a CMOS (complementary-type MOS transistor) of a ring oscillator circuit, as an resolution for the situation that oscillation period is increased at high temperature region by the on-resistance of a transistor resulting in increased DRAM refresh period. Patent Document 1, although aiming mainly at outputting an oscillation period with a constant period without dependent upon temperature, discloses the capability of providing a ring oscillator circuit having an oscillation period decreasing with increasing temperature by the use of such a resistance element that resistance value decreases with increasing temperature.

By incorporating such a resistance element that resistance value decreases with increasing temperature in an oscillator circuit for adjusting a capacitor charge/discharge time by the magnitude of resistance value of the resistance element, it is possible to provide a ring oscillator circuit having a feature that oscillation period is short at high temperature but long at low temperature.

FIG. 1 is the simplest configuration example of such a ring oscillator circuit. An oscillator circuit 400 is configured by the series connection in a sequential ring form of an inverter 402 at the first stage including one delay circuit 426, three middle-stage inverters 404, 406 and 408, and an inverter 410 at the last stage. Herein, in order to connect the oscillator circuit 400 to an outside, the final-stage inverter 410 is configured by a NAND circuit. The NAND circuit 410 has two input terminals to which connected are an output terminal of the preceding-stage inverter 408 and an external terminal to be inputted by a binary signal $S_T$. The NAND circuit 410 is under control of inputting the signal $S_T$. Assuming that one binary value is "1", i.e. "high level" and the other is "0", i.e. "low level", when the signal $S_T$ is at high level, the oscillator circuit assumes an on-state and the NAND circuit 410 operates as an inverter.

The inverter 402 for the first stage has a transistor series circuit 424 having a PMOS transistor (referred also to as PMOST) 414 and an NMOS transistor (referred also to as NMOST) 416 connected in series at their main current passages, and the delay circuit 426 connected to the transistor series circuit 424 and for providing a delay to an output of the inverter 402. This delay circuit 426 is configured by a temperature-dependent resistance element 418 and a capacitor 420. Incidentally, 412 and 422 represent nodes.

The ring oscillator circuit 400 has an oscillation period greatly varying depending upon the time required in discharging the charge stored on the capacitor 420. When the temperature-dependent resistance element 418 increases its resistance value, the flowing current decreases to increase the time required for discharge, proportionally increasing the oscillation period. Accordingly, on the ring oscillator circuit 400, because the resistance value of the temperature-dependent resistance element 418 decreases with increasing temperature, the oscillation period is shorter as temperature rises.

FIG. 2 is a graph outlining the relationship between an oscillation period outputted by the ring oscillator circuit 400 shown in FIG. 1 and a temperature.

The vertical axis represents a common logarithm value of a relative value at each temperature when the oscillation period at 80° C. is taken 1. The horizontal axis denotes a temperature (unit: ° C.).

The refresh period, required for the DRAM to hold data, empirically increases to approximately 1.4 times as temperature lowers by 10° C. Consequently, the graph shows the case assuming that, the temperature characteristic of the temperature-dependent resistance element 418 is such that the resistance value increases to 1.35 times as the temperature lowers by 10° C.

Because oscillation period is proportional to the magnitude of resistance value of the temperature-dependent resistance element 418, as temperature rises the resistance value decreases to shorten the oscillation period. Conversely, as temperature lowers the resistance value of the temperature-dependent resistance element 418 increases to increase the oscillation period. The DRAM refresh period at low temperature can be increased by the increased oscillation period. This can reduce consumption power.

Such a ring oscillator circuit, having a charge/discharge circuit built with a capacitor and resistance element, is quite useful because of its resistance to MOS transistor manufacturing variations and to power voltage fluctuations and of its simple circuit structure.

However, in the temperature-dependent resistance element 418 of the ring oscillator circuit 400, the resistance value continues to lower as temperature lowers. Accordingly, there is no maximum value in the oscillation period outputted by the ring oscillator circuit 400.

Accordingly, because the refresh period increases as temperature lowers, memory test is required over a broad temperature range. When to take a long refresh interval in the memory test under the self-refresh mode (i.e. memory test on operating the internal timer), test must be conducted at low temperature. Particularly, for a test at 0° C. or lower, because there is an apparatus that the moisture in air freezes to raise a problem, an expensive test apparatus is required to prevent this.

Meanwhile, in the DRAM memory cell, there are some route to leak the charge stored on the capacitor. In most cases, the leak current increases with increasing temperature. Rarely, there exists a memory cell having a route where leak current does not decrease even at low temperature because of microscopic defects or the like. In the oscillator circuit using a resistance element having a resistance value not changing on temperature, because a refresh interval is set required in a high temperature region, there is no need to exclude such memory cells as defective cells.

However, where using a conventional ring oscillator circuit having a resistance element having a resistance value increasing with increasing temperature, oscillation period increases at low temperature. The memory cells, having routes not decreasing leak current even at low temperature as in the above, are all excluded and replaced with spare memory cells (redundant cells). This lowers the yield in the manufacture of semiconductor integrated circuits.

Consequently, in case a maximum value can be set on the oscillation period increasing with decreasing temperature, test is not required at low temperature. Furthermore, in case a maximum value of oscillation period can be set, it is possible to reduce the replacing number of memory cells having routes not decreasing leak current even at low temperature as in the above, with redundant cells. This can improve the yield in the manufacture of semiconductor integrated circuits.

There is disclosed a method for setting a maximum value on oscillation period, for example, in Japanese Patent Kokai No. 5-307882 (Patent Document 2). In this Patent Document 2, a temperature detecting circuit is formed by the oscillation period of a CR oscillator circuit having a resistance element possessing a positive temperature characteristic. In this temperature detecting circuit, temperature region is divided into three, to change the outputs between the temperature regions. With the outputs, the frequency dividing period by the frequency divider circuit or the oscillation period by the ring oscillator is adjusted and used for DRAM refresh period.

However, in the method shown in Patent Document 2, the oscillation period by the ring oscillator abruptly varies at a temperature switching the output of the temperature detecting circuit.

In the circuit of Patent Document 2, the oscillation period is not in a straight line having a nearly constant inclination as haven on the graph of FIG. 2. The oscillation period assumes nearly constant in certain three temperature ranges set continuously. However, the oscillation period, because of abruptly varying at a temperature switching the oscillator circuit, assumes an oscillation characteristic varying stepwise.

Depending upon at what temperature the two switch points are set, the characteristic of oscillation period is greatly different. Hence, there is difficulty in determining the same. In order to reduce the memory cells replaced with redundant cells by a memory test, there is a necessity to suitably adjust the switching temperature. This makes oscillator circuit design quite difficult.

Consequently, there is a demand for an oscillator circuit having a temperature characteristic that the oscillation period is short at high temperature but long at low temperature and, moreover, allowed to be set with a maximum value of oscillation period.

Furthermore, in order to smoothen the adjustment for an oscillation period against temperature change, there is a demand for an oscillator circuit that can suppress an abrupt change of oscillation period in the usual-service temperature range.

Therefore, the inventor of the present invention has concluded that, by connecting the different resistances of resistance elements in parallel, oscillation period moderately varies such that it is short at high temperature but long at low temperature and, moreover, a maximum value of oscillation period can be set in a low temperature region.

SUMMARY OF THE INVENTION

A semiconductor integrated circuit according to a first aspect of this invention has a plurality of CMOS inverters connected in an odd number of stages and a ring oscillator circuit for feeding an output signal of a CMOS inverter at the final stage back to an input end of a CMOS inverter at the first stage thereby causing self-oscillation. The first stage CMOS inverter has a transistor series circuit including PMOS and NMOS transistors coupled between a power voltage terminal and a reference voltage terminal, and a delay circuit for delaying an output signal of the first stage CMOS inverter. The delay circuit has a capacitor coupled between an output node of the first stage CMOS inverter and the reference voltage terminal, and a resistance parallel circuit inserted coupled on a current passage of the transistor series circuit at between the output node and the reference voltage terminal. The resistance parallel circuit is configured by a parallel connection of a plurality of resistance elements different in resistance-value temperature characteristic.

Herein, the word coupling mentioned above signifies to directly or indirectly connect circuits or terminals. For example, in the case that a transistor series circuit including PMOS and NMOS transistors is coupled between a power voltage terminal and a reference voltage terminal, the PMOS transistor may be directly connected to the power voltage terminal or connected through other active or passive circuits or elements. Namely, where the object of the invention is not prevented against achievement, connection may be through other elements or circuits. Similarly, other active or passive circuits or elements may be connected between the resistance parallel circuit of the delay circuit and the output node.

According to the above configuration of the semiconductor integrated circuit of the first aspect of this invention, oscillation period moderately varies such that it is short at high temperature but long at low temperature and, moreover, a maximum value of oscillation period can be set in a low temperature region.

Preferably, the plurality of resistance elements different in resistance-value temperature characteristic are a first resistance element having a resistance value decreasing with increasing temperature and a second resistance element having a resistance value nondependent upon temperature.

Generally, there exists no resistance element having a resistance value perfectly nondependent upon temperature, i.e. usually, the resistance value changes within a range of approximately 1%. Herein, the used resistance element having a resistance value nondependent upon temperature refers to a resistance element having a resistance value varying with temperature, within a quite narrow range (usually approximately 1%) with respect to a set resistance value as noted above, i.e. a resistance element having a resistance value less varying. Meanwhile, in order to simplify explanation, the resistance element having a resistance value decreasing with increasing temperature is referred to as a temperature-dependent resistance element while the resistance element having a resistance value nondependent upon temperature is as a temperature-nondependent resistance element.

According to the above configuration example of the semiconductor integrated circuit of the first aspect of the invention, at high temperature, output is with an oscillation period as determined much affected by the temperature-dependent resistance element. At low temperature, output is with an oscillation period as determined much affected by the temperature-nondependent resistance element. Meanwhile, the oscillator circuit offered by the semiconductor integrated circuit is allowed to have a temperature characteristic that oscillation period is longer as temperature lowers and the oscillation-period change rate against temperature decreases as the temperature lowers thus being converged to a maximum value.

Due to this, in case the oscillation period on the output signal of the semiconductor integrated circuit is used for a refresh period in a DRAM self-refresh mode, the maximum period can be placed under control, i.e. converged into a constant value. Accordingly, memory test time can be prevented from increasing. Meanwhile, because the memory cells to be replaced with redundant cells can be decreased in the number, yield can be improved in the manufacture of DRAMs.

A semiconductor integrated circuit according to a second aspect of the invention has a plurality of CMOS inverters connected in an odd number of stages and a ring oscillator circuit for feeding a final-stage output signal of a final-stage CMOS inverter back to an input end of a first-stage CMOS inverter thereby causing self-oscillation. The first-stage CMOS inverter has first and second sub-CMOS inverters to which the final-stage output signal is to be fed back. A second-stage CMOS inverter is configured by a logic gate having first and second input terminals to which first and second first-stage output signals of the first and second sub-CMOS inverters are to be respectively supplied. The first sub-CMOS inverter has a first transistor series circuit including a first PMOS transistor and first NMOS transistor coupled between a power voltage terminal and a reference voltage terminal, and a first delay circuit for delaying the first-stage output signal. The second sub-CMOS inverter has a second transistor series circuit including a second PMOS transistor and second NMOS transistor coupled between a power voltage terminal and a reference voltage terminal, and a second delay circuit for delaying the second-stage output signal. The first delay circuit has a first capacitor coupled between a first output node of the first sub-CMOS inverter and the reference voltage terminal and a first resistance element inserted and coupled on a current passage of the first transistor series circuit at between the first output node and the reference voltage terminal and having a resistance value decreasing with increasing temperature. The second delay circuit has a second capacitor coupled between a second output node of the second sub-CMOS inverter and the reference voltage terminal and a second resistance element inserted and coupled on a current passage of the second transistor series circuit at between the second output node and the reference voltage terminal and having a resistance value nondependent upon temperature.

According to the above configuration of the semiconductor integrated circuit of the second aspect of the invention, in a high temperature region, oscillation period is determined and outputted by the first delay circuit. In a low temperature region, oscillation period is determined and outputted by the second delay circuit. As a result, oscillation period is shorter at high temperature but longer at lower temperature. Because the oscillation period by the second delay circuit is not dependent upon temperature, the maximum value of oscillation period can be set at low temperature.

Herein, in case the temperature setting for reaching the maximum value is at a temperature of 0° C. or higher, there is no need of conducting a memory test in self-refresh mode at 0° C. or lower. This eliminates the necessity of using an expensive apparatus for preventing freeze or the like. Meanwhile, because the maximum value of oscillation period can be set small, the time required for the memory test entirely is satisfactorily short. Meanwhile, it is possible to take great the inclination based on temperature change during oscillation in the first delay circuit. Furthermore, because the maximum value can be set, oscillation period change can be set more freely.

Meanwhile, according to a semiconductor integrated circuit according to a third aspect of the invention, an oscillation period determining device includes first and second oscillation period determining circuits, to output as a final output an output signal shorter in oscillation period of two output signals outputted by the two oscillation period determining circuits. The first oscillation period determining circuit has a first oscillator circuit. The first oscillator circuit has a plurality of CMOS inverters connected in an odd number of stages, so that an output signal of a final-stage CMOS inverter can be fed back to an input end of a first-stage CMOS inverter thereby causing self-oscillation. The first-stage CMOS inverter has a first transistor series circuit including a first PMOS transistor and first NMOS transistor coupled between a power voltage terminal and a reference voltage terminal, and a first delay circuit for delaying the first-stage output signal of the first-stage CMOS inverter. The first delay circuit has a first capacitor coupled between a first output node of the first sub-CMOS inverter and the reference voltage terminal and a first resistance element inserted and coupled on a current passage of the first transistor series circuit at between the first output node and the reference voltage terminal and having a resistance value decreasing with increasing temperature. The second oscillation period determining circuit outputs an output signal having an oscillation period nondependent upon temperature.

According to the above configuration of the semiconductor integrated circuit of the third feature of the invention, in a high temperature region, oscillation period is determined and outputted by the first oscillation frequency determining circuit. In a low temperature region, oscillation period is determined and outputted by the second oscillation frequency determining circuit. Due to this, oscillation period is shorter at high temperature but longer at lower temperature. Because the oscillation period by the second oscillation frequency determining circuit is not dependent upon temperature, the maximum value of oscillation period can be set at low temperature region.

Meanwhile, the first oscillation period determining circuit suitably has a first frequency divider circuit for dividing a frequency of an output signal of the first oscillator circuit and adjusting oscillation period. The first frequency divider circuit has an adjuster for changing a frequency dividing period in order to dividing a frequency of an output signal of the first oscillator circuit.

According to the above configuration example of the semiconductor integrated circuit of the third feature of the invention, because the frequency divider circuit adjusts the output of the oscillator circuit, adjustment is easy even when there is variation in the temperature characteristic of the temperature-dependent resistance element. Accordingly, by the first oscillation period determining circuit using a temperature-dependent resistance element and the second oscillation period determining circuit using a temperature-nondependent resistance element, the change of oscillation period with temperature can be set at high freedom. Meanwhile, rather than adjusting the oscillation period only by a resistance value magnitude of the resistance element, resistance element magnitude, i.e. resistance value, can made small, hence reducing the area on an integrated circuit.

BRIEF DESCRIPTION OF THE DRAWINGS

FIG. 8 is a figure showing a temperature characteristic of oscillation period of the oscillator circuit in the second embodiment;

DETAILED DESCRIPTION OF THE INVENTION

Embodiments of the present invention will now be described with reference to the drawings. Note that, in the below explanation, the ring oscillator circuit in certain cases is referred merely to as an oscillator circuit in order to simplify explanation.

[First Embodiment]

Figure 1:
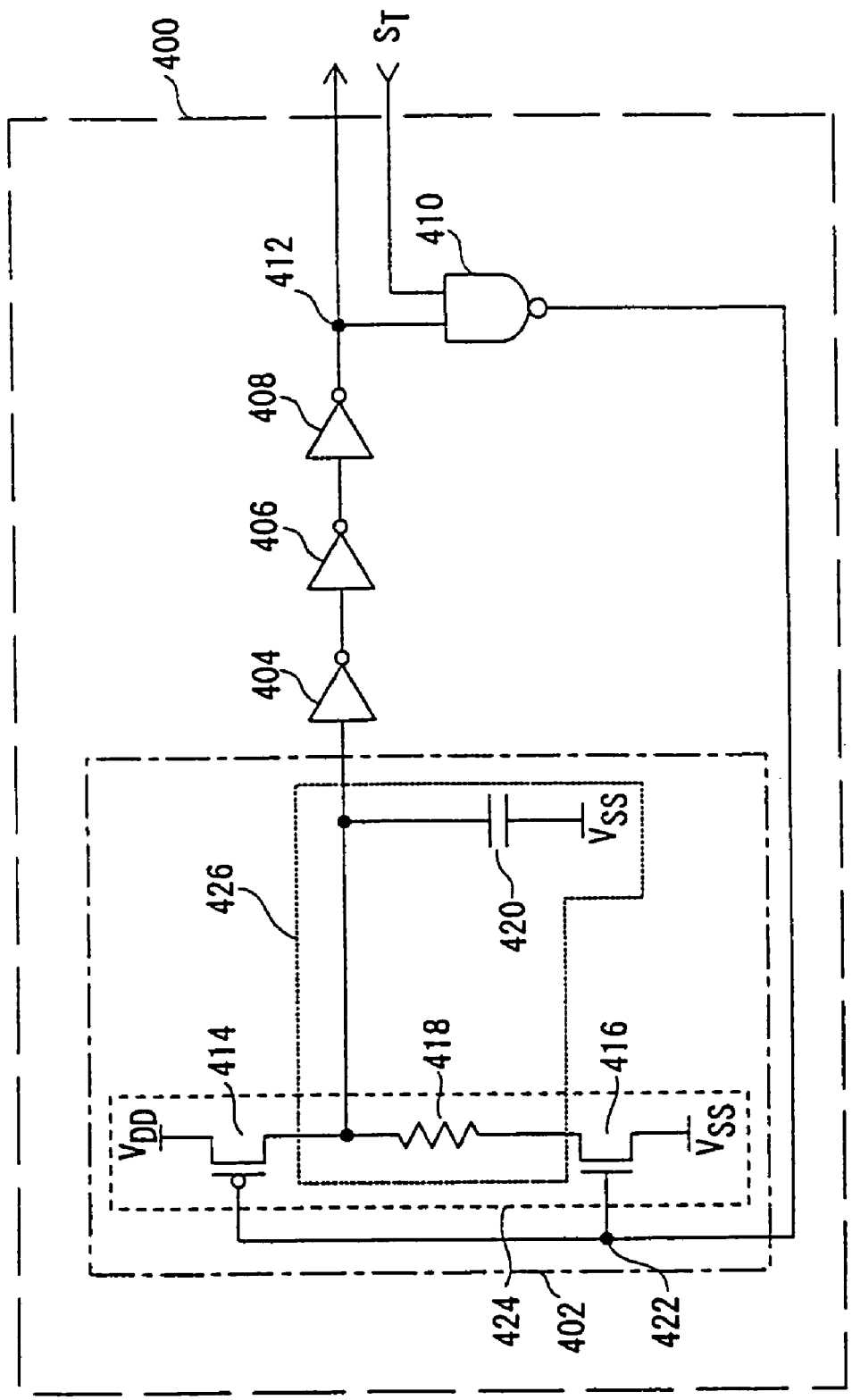
FIG. 1 is a circuit diagram showing a configuration example of an oscillator circuit in a prior art.
Figure 2:
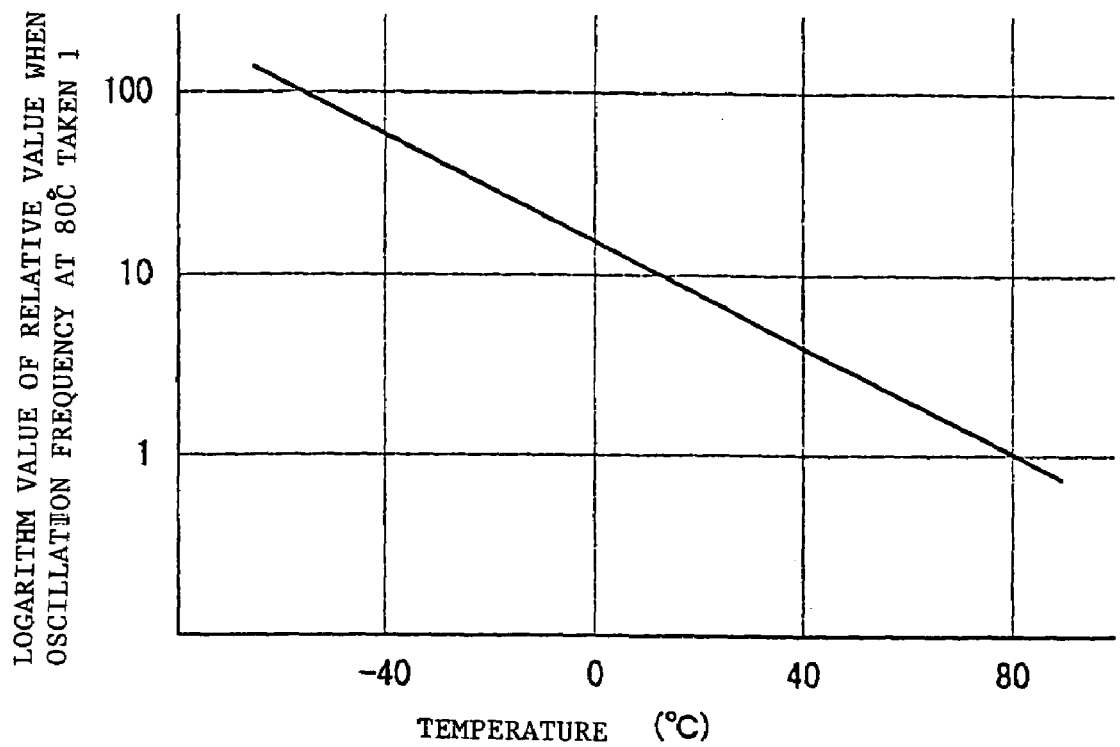
FIG. 2 is a figure showing a temperature characteristic of oscillation period of the oscillator circuit in the prior art.
Figure 3:
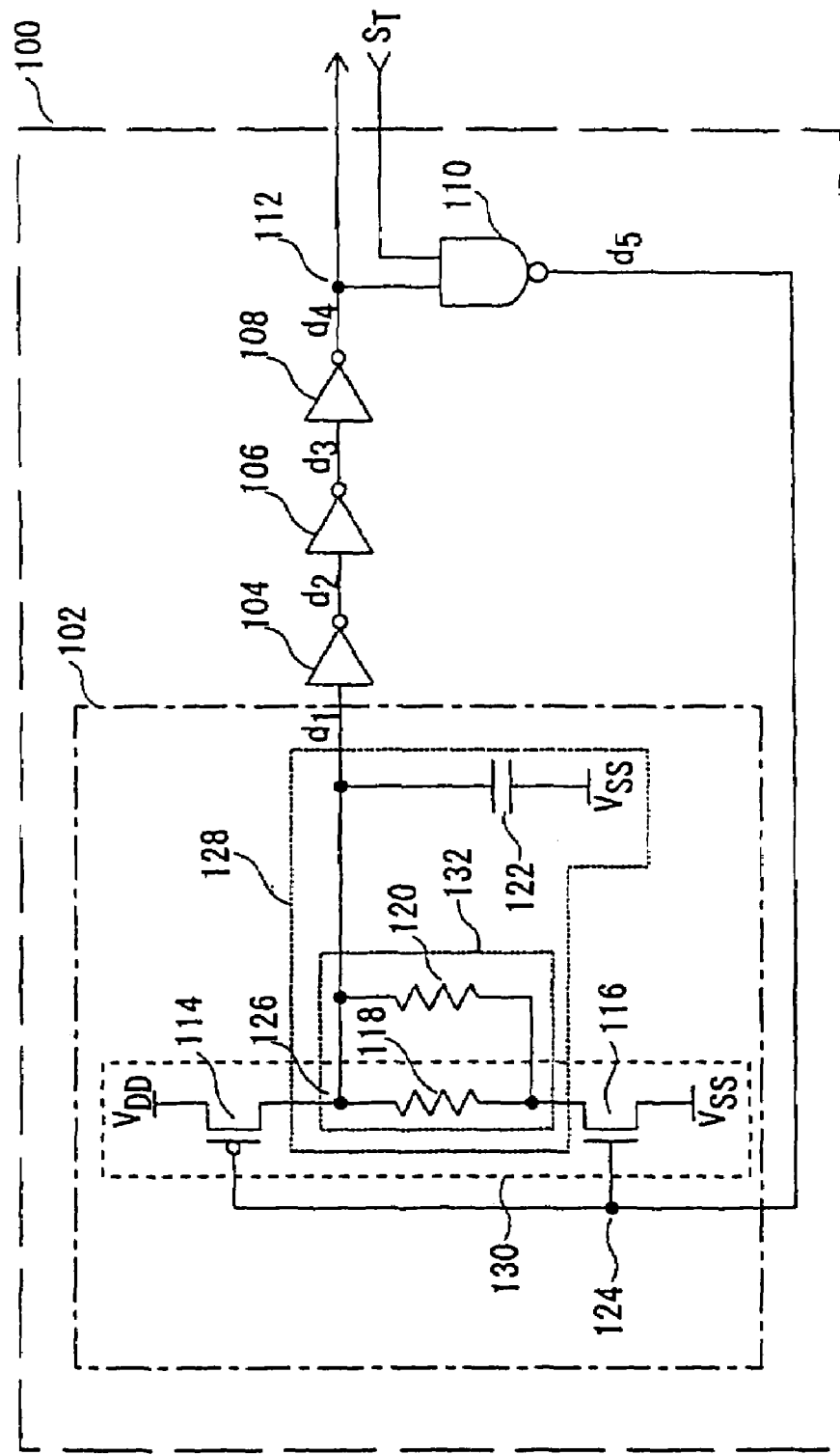
FIG. 3 is a circuit diagram of an oscillator circuit in a first embodiment.
Figure 4:
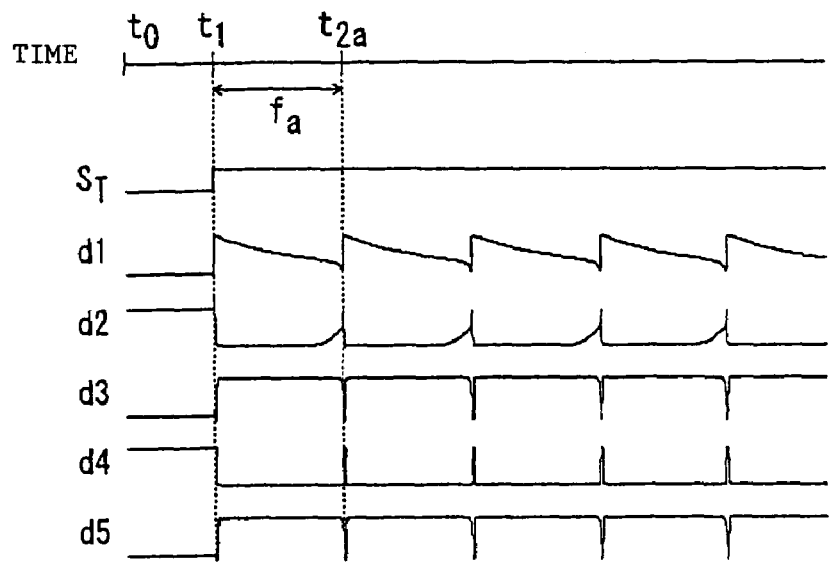
FIG. 4 is a schematic figure of an operating waveform outputted by the oscillator circuit in the first embodiment.
Figure 5:
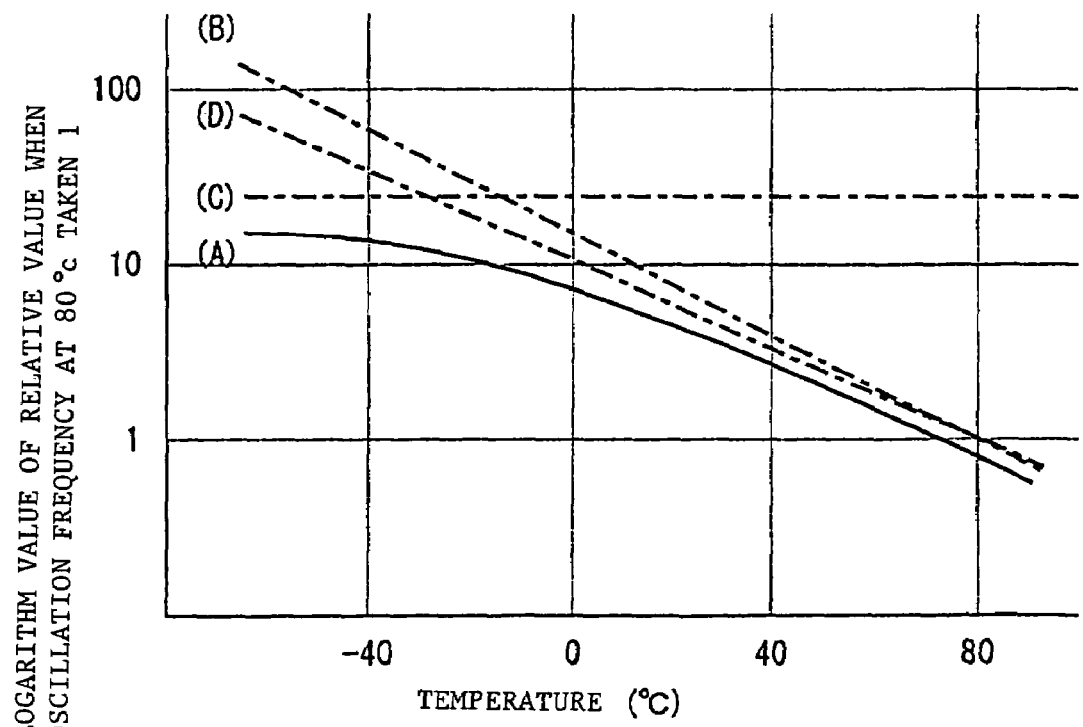
FIG. 5 is a figure showing a temperature characteristic of oscillation period of the oscillator circuit in the first embodiment.

Referring to FIGS. 3 to 5, explanation is made on a first embodiment of a semiconductor integrated circuit according to the present invention.

FIG. 3 is a circuit diagram of an oscillator circuit in the first embodiment.

The oscillator circuit 100 is configured including a plurality of CMOS inverters connected over an odd number of stages, so that a final-stage output signal of a final-stage CMOS inverter can be fed back to an input end of a first-stage CMOS inverter thereby causing self-oscillation. Hereinafter, the CMOS inverter is also referred to merely as an inverter.

The oscillator circuit 100 is configured by a series connection in a sequential ring form of the first-stage inverter 102 including one delay circuit 128, three middle-stage inverters 104, 106 and 108, and the final-stage inverter 110. Herein, the final-stage inverter 110 is configured by a NAND circuit having first and second input terminals, in order to connect the oscillator circuit 100 to the external circuit. The first input terminal is connected to an output terminal of the previous-stage inverter 108. The NAND circuit 110 is under control of a binary signal $S_T$ externally inputted to the second input terminal of the NAND circuit 110. Assuming that one of the binary is "1" or "high level" and the other is "0" or "low level", when the signal $S_T$ is at high level, the oscillator circuit is in an on-state and the NAND circuit 110 operates as an inverter.

The first-stage inverter 102 has a transistor series circuit 130 having two transistors 114 and 116 different in conductivity type connected in series at their main current passages, and the delay circuit 128 connected with the transistor series circuit 130 and for giving a delay to a first-stage output signal of the inverter 102. The delay circuit 128 is configured by a resistance parallel circuit 132 formed by two resistance elements (i.e. first and second resistance elements) 118 and 120 different in temperature coefficient, and a capacitor 122. In the invention, the capacitor 122 is connected between an output node of the first-stage inverter and a reference voltage terminal. Meanwhile, the resistance parallel circuit 132 is inserted and connected on a current passage of the transistor series circuit 130 at between the output node of the first-stage inverter and the reference voltage terminal.

In the configuration example shown in FIG. 3, the transistor series circuit 130 of the first-stage inverter 102 is connected between a power voltage ($V_{DD}$) terminal (hereinafter, referred also to as a bias voltage terminal) and a reference voltage ($V_{SS}$) terminal (e.g. ground (GND)). The PMOST 114, or the first transistor, has one main electrode connected to the $V_{DD}$ terminal. The other main electrode of the PMOST 114 is coupled to the other main electrode of the NMOST 116, or the second transistor, through the resistance parallel circuit 132. One electrode of the NMOST 116 is coupled to the $V_{SS}$ terminal. The PMOST 114 and the NMOST 116 have respective control (gate) electrodes connected common by a connection point (also called a node). Of the two resistance elements, the one or first resistance element 118 has a characteristic that resistance value decreases with increasing temperature (hereinafter, referred also to as a temperature-dependent resistance element). The other or second resistance element 120 has a characteristic that there is less change in resistance value against temperature change (hereinafter, referred also to as a temperature-nondependent resistance element). The two resistance elements, in a parallel connection state, are connected between a drain electrode as the other main electrode of the PMOST 114 and a drain electrode as the other main electrode of the NMOST 116. The capacitor 122 is connected between a drain electrode of the PMOST 114 and the $V_{SS}$ terminal. An output terminal of the inverter 102 is the drain electrode of the PMOST 114. In FIG. 3, this output terminal is shown as a connection point (referred to as an output node) 126 of the drain electrode of PMOST 114, the resistance parallel circuit 132 and the capacitor 122. Incidentally, the foregoing other inverters 104, 106, 108 and 110 basically have respective independent transistor series circuits of PMOSTs and NMOSTs connected between the $V_{DD}$ terminal and the $V_{SS}$ terminal similarly to the prior art.

Now, explanation is made on the operation of the oscillator circuit 100. In the below explanation, the high level corresponding to binary "1" is represented by a voltage $V_{DD}$ while the low level corresponding to binary "0" is by a voltage $V_{SS}$ (in this embodiment, $V_{SS}$=0V because of grounded). Incidentally, in the below explanation, $d_1$ represents a first-stage output signal of the first-stage inverter 102, $d_2$ an output signal of the second-stage inverter 104, $d_3$ an output signal of the third-stage inverter 106, $d_4$ an output signal of the fourth-stage inverter 108, and $d_5$ a final-stage output signal of the final-stage inverter 110. FIG. 4 shows the outline of an operation waveform of the oscillator circuit 100.

In case a high-level signal is externally inputted as an input signal $S_T$ to the second input terminal of the NAND circuit 110, a low-level signal $d_5$ is outputted from the NAND circuit 110. Because the low-level signal is conveyed to the node 124, the low-level signal is inputted to the control (gate) electrodes of the PMOST 114 and NMOST 116. Due to this, the PMOST 114 turns on and the NMOST 116 turns off, to store charge on the capacitor 122. Simultaneously, a high-level signal $d_1$ is supplied to the inverter 104. A low-level signal $d_2$ is outputted from the inverter 104 and then changed to high level and low level in the order by the inverters 106, 108. A low-level signal $d_4$ is outputted from a node 112 to the outside. Simultaneously, the low-level signal is inputted to the NAND circuit 110. Incidentally, the node 112 is a connection point between the output terminal of the inverter 108 and the first input terminal of the final-stage inverter 110, which in this configuration example forms an output terminal of the oscillator circuit 100.

The NAND circuit 110, in a state the signal $S_T$ to the second input terminal is at high level, operates similarly to the inverter. It outputs, as a final-stage output signal, a signal reverse to the signal inputted to the first terminal (low level when high level, high level when low level). Accordingly, herein a high-level signal $d_5$ is outputted from the NAND circuit 110. From the NAND circuit 110, the high-level signal is inputted to the gate electrodes of the PMOST 114 and NMOST 116. This cause the PMOST 114 to turn on and the NMOST 116 turn on, to gradually release the charge stored on the capacitor 122. Simultaneously, a low-level signal $d_1$ is sent to the inverter 104. From the inverter 104, a high-level signal $d_2$ is outputted and then changed to low level and high level in the order by the inverters 106, 108, to output a high-level signal $d_4$ from the node 112 to the outside. Simultaneously, the high-level signal $d_4$ is inputted to the NAND circuit 110. Because of outputting a low-level signal $d_5$ from the NAND circuit 110, the above operation is repeated. Thus, high-level and low-level signals $d_4$ are outputted with a constant period to the outside.

In the initial state, the output signals $d_1$ and $d_3$ are set at low level while $d_2$ and $d_4$ are at high level. A high-level signal is inputted as the input signal $S_T$, the NAND circuit 110 outputs a low-level final-stage output signal $d_5$. The low-level signal is conveyed to the control electrodes of the PMOST 114 and NMOST 116, to turn the PMOST 114 on and the NMOST 116 off. In this oscillator circuit 100, because the resistance parallel circuit 132 does not participate on the passage for storing charge to the capacitor 122, the first-stage output signal $d_1$ becomes high in level swiftly. Then, the signal $d_2$ assumes low level, the signal $d_3$ high level and the signal $d_4$ low level. Because the signal $d_4$, i.e. low level signal, is inputted to the final-stage NAND circuit 110, the node 124 becomes high level. Consequently, the PMOST 114 is off and the NMOS 116 is on, to gradually release the charge stored on the capacitor 122. Because the discharge route from the capacitor 122 is via the resistance parallel circuit 132, the resistance parallel circuit 132 delays the discharge time and hence the signal $d_1$ gradually changes into low level. By outputting the signal $d_1$, the signal $d_2$ gradually changes into high level. The signal $d_3$ becomes low level and the signal $d_4$ becomes high level, in the order. When the signal $d_4$ becomes high level, a low-level final-stage output signal $d_5$ is outputted again from the NAND circuit 110. In the state $S_T$ is at high level, i.e. an on-signal has been inputted, this operation is repeated, thus periodically outputting low-level and high-level signals in an operating waveform as shown in FIG. 4. Assuming that the time at which a high-level signal has been inputted as the input signal $S_T$ is $t_1$, the time period of up to a time $t_{2a}$ required for the signal $d_1$ to become low level owing to discharge of the capacitor 122 provides an oscillation period $f_a$. Outputting a signal $d_4$ representative of high level to the outside with a constant period, or with an oscillation period $f_a$, makes possible to use as a ring oscillator circuit.

The time period, required in a voltage change of from high level to low level due to discharging the charge stored on the capacitor 122, relies upon a magnitude of the resistance value R of the resistance parallel circuit 132, i.e. it takes a longer time as the resistance value R is greater. Consequently, the greater the resistance value R of the resistance parallel circuit 132, the longer is the oscillation period fa. Accordingly, the oscillation period can be varied by adjusting the resistance value R of the resistance circuit.

In the oscillator circuit 100, the resistance value R of the resistance parallel circuit 132 can be expressed by the following Equation (1) provided that, of the two resistance elements in parallel connection, the temperature-dependent resistance element 118 has a resistance value $R_1$ and the temperature-nondependent resistance element 120 has a resistance value $R_2$.

$$R=1/\{(1/R_1)+(1/R_2)\} \qquad (1)$$

From the Equation (1), the resistance value $R_2$ of the temperature-nondependent resistance element $R_2$ herein is constant. When the resistance value $R_1$ of the temperature-dependent resistance element increases, the denominator value of Equation (1) decreases to increase the resistance value R of the resistance parallel circuit. When the resistance value $R_1$ of the temperature-dependent resistance element decreases, the denominator value of Equation (1) increases to decrease the resistance value R of the resistance parallel circuit.

Now, comparison is made in magnitude between the resistance value $R_1$ of the temperature-dependent resistance element 118 and the resistance value $R_2$ of the temperature-nondependent resistance element 120. The resistance value $R_1$ is dependent upon temperature, i.e. resistance value is smaller in the higher temperature region whereas it is greater in the lower temperature region. Namely, the reciprocal $1/R_1$ is great at high temperature but small at low temperature. Meanwhile, because of the reason that the resistance value $R_2$ is not dependent upon temperature, $1/R_2$ is at constant.

As the resistance value $R_1$ becomes smaller than the resistance value $R_2$, i.e. as $1/R_1$ becomes greater than $1/R_2$, the denominator value on the right-hand side of Equation (1) is more influenced by $R_1$. Accordingly, the magnitude of R is determined by $R_1$, thus being dependent upon temperature.

As the resistance value $R_1$ becomes greater than the resistance value $R_2$, i.e. as $1/R_1$ becomes smaller than $1/R_2$, the denominator value on the right-hand side of Equation (1) is less influenced by $R_1$. Accordingly, the magnitude of R is determined by $R_2$, thus being less dependent upon temperature.

From the above, in the oscillator circuit 100, the resistance values $R_1$, $R_2$ are adjusted such that the resistance value R in the high-temperature region is small and affected by $R_1$ thus being dependent upon temperature while the resistance value R in the low-temperature region is great and less affected by $R_1$ thus being not dependent upon temperature.

Explanation is made on the case of determining resistance values $R_1$, $R_2$ on the assumption that the oscillator circuit 100 is used for a DRAM refresh period. The service temperature range of DRAMs is usually considered in the range of 0° C.–80° C. Accordingly, explanation herein is made on the assumption that the high-temperature region is at around 80° C. while the low-temperature region is at around 0° C. The resistance value $R_2$ of the temperature nondependent resistance element 120 is set 10 to 20 times greater than the resistance value $R_1$ of the temperature dependent resistance element 118 in the high temperature region. Meanwhile, the temperature dependent resistance element 118 is preferably given a temperature coefficient in a range of 1.35–1.45. Herein, the temperature coefficient of temperature dependent resistance element represents what times the resistance value is as temperature decreases 10° C. For example, taking a resistance value 1 at 80° C., in the case that the resistance value at 70° C. is 1.25 times the resistance value at 80° C., then the temperature coefficient is 1.25. The temperature characteristic of a DRAM memory cell usually has a temperature coefficient of approximately 1.4. In the high-temperature region, in case the temperature coefficient of the temperature-dependent resistance element 118 is set in a range of 1.35–1.45, the temperature coefficient of the resistance parallel circuit 132 is nearly in a range of 1.25–1.35 under the influence of the resistance value of the temperature-nondependent resistance element 120. Accordingly, because the DRAM temperature coefficient is not to be exceeded, the change rate of resistance value with temperature, i.e. the change rate of oscillation period, is a suitable change rate for the DRAM temperature characteristic. In the low-temperature region, because oscillation period is greatly affected by a resistance value of the temperature-nondependent resistance element, the resistance-value change rate on the resistance parallel circuit 132 decreases to gradually approach the maximum value. Accordingly, even if temperature further lowers, there is no possibility that the oscillation period continue toward increase.

FIG. 5 is a graph of temperature characteristic representing the relationship between an oscillation period of the oscillator circuit 100 and a temperature.

The horizontal axis represents a temperature (unit: ° C.) while the vertical axis represents a logarithm value of relative value when the oscillation period at 80° C. is taken 1.

A graph (A) shows a temperature characteristic of oscillation period of the oscillator circuit 100.

In the high-temperature region, i.e. at around 80° C., oscillation period depends upon temperature. The higher the temperature, the shorter the period becomes, thus showing a change approximate to an oscillation period graph (B) on a circuit using only the temperature-dependent resistance element (referred also to as an asymptotic line 1). As the temperature decreases, the period change rate against a temperature change nears zero and converges to a constant value. This constant value herein is referred to as the maximum value of oscillation period, which is shown by a graph (C) (referred also to as an asymptotic line 2). A graph (D) shows a characteristic of refresh period against temperature required by a DRAM memory cell discharge characteristic.

It is known that the DRAM memory cell has a discharge characteristic increasing to 1.4 times as temperature increases 10° C. From this fact, the inclination of a graph (D) on the characteristic of refresh period against temperature required by a DRAM memory cell discharge characteristic is preferably given in a range of 1.25–1.35 a little smaller than that. Consequently, from the relationship with the resistance value of the temperature-nondependent resistance element 120 connected parallel, the change rate of resistance value $R_1$ of the temperature-dependent resistance element 118 against temperature is set in a range of 1.35–1.45 per 10° C. This corresponds to the inclination of the asymptotic line 1. Meanwhile, the resistance value $R_2$ of the temperature-nondependent resistance element is set at approximately 10 to 20 times the resistance value in the high-temperature range of the temperature-dependent resistance element (e.g. 80° C. herein). With this setting, the oscillation period-versus-temperature characteristic graph (A) for the oscillator circuit 100 has an inclination of approximately 1.25–1.35 at around 80° C. Meanwhile, the oscillation period at 0° C. is approximately 5 to 10 times the oscillation period at 80° C. The oscillation period of the oscillator circuit 100, even where temperature changes, can be taken always smaller than the refresh period required for the memory cell and as great as possible within a required range of refresh period. Because a great period can be taken within a required range, it is possible to suppress the consumption power required in DRAM refresh.

As is apparent from the temperature characteristic graph, the oscillation period in the high temperature range is shorter as temperature increases. Meanwhile, in the low-temperature region, the oscillation period increases as temperature decreases. However, the change rate decreases to near a constant value, i.e. the maximum value. The memory test in self mode is satisfactorily conducted up to this constant value, i.e. to the maximum period of this oscillator circuit 100.

According to the oscillator circuit of the first embodiment, the higher the temperature the shorter the oscillation period is while the lower the temperature the longer it becomes. Meanwhile, although the lower the temperature the longer the oscillation period is, the lower the temperature the smaller the oscillation-period change rate with temperature is, thus making it possible to provide an oscillator circuit possessing a temperature characteristic converging to the maximum value.

[Second Embodiment]

Figure 6:
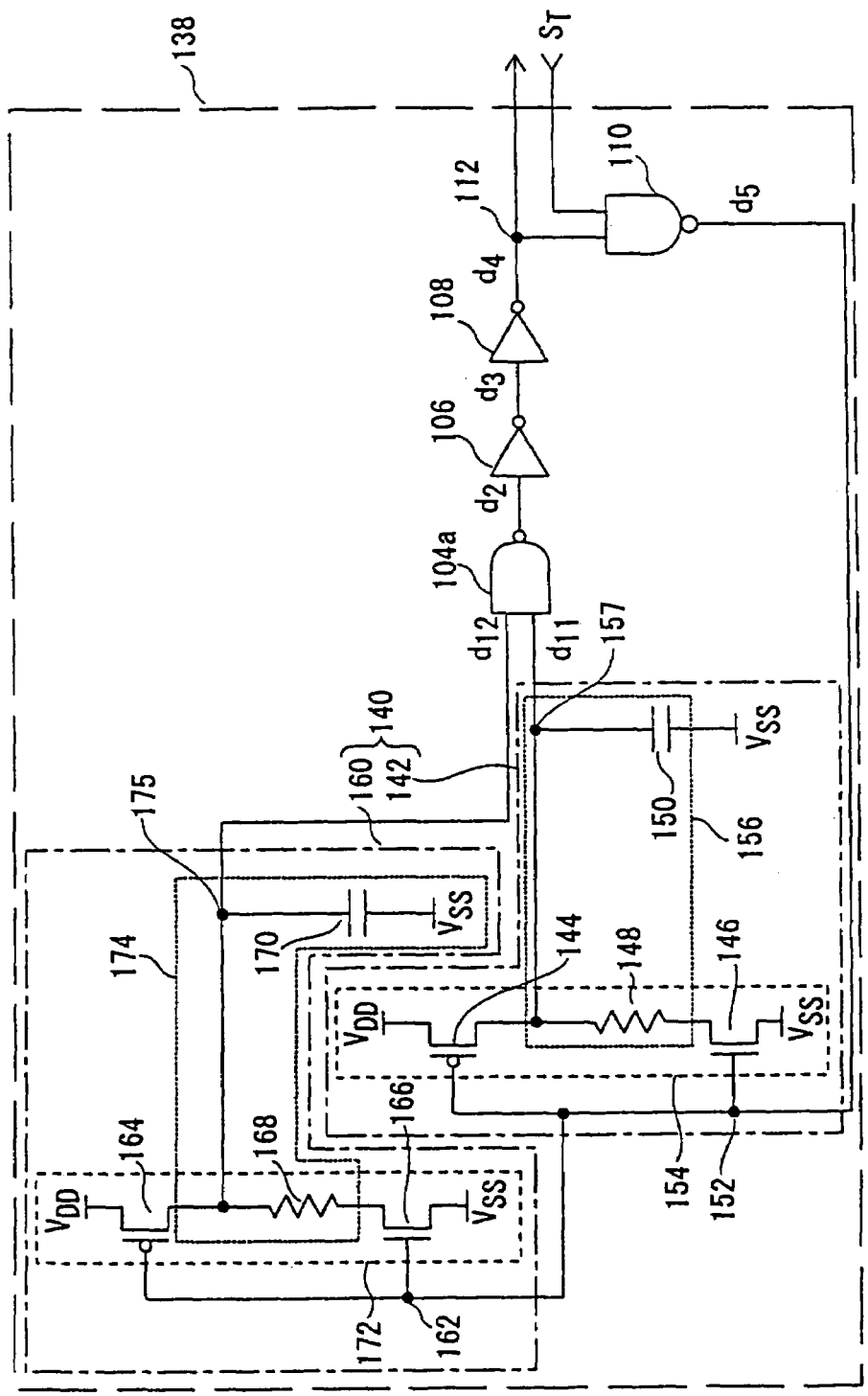
FIG. 6 is a circuit diagram of an oscillator circuit in a second embodiment.

Referring to FIGS. 6 to 8, explanation is made on a second embodiment of the invention.

In the oscillator circuit 100 of the first embodiment, because oscillation period at a low temperature nears a certain constant value (this value is referred also to as the maximum value of oscillation period of the oscillator circuit 100), there is no possibility that oscillation period increase exceeding that value. However, in case to take a required oscillation-period change width (usually, three to four times the oscillation period) at a usual service temperature (0–80° C.), there is a case that the maximum value of oscillation period must be set great. In such a case, because the oscillation period at 0° C. not yet reached the maximum value, there is a need to conduct a memory test at a further lower temperature. In the test at a temperature equal to or lower than 0° C., an expensive apparatus is needed in order to avoid freezing of the moisture in air.

Meanwhile, in order to reduce the memory cells to be replaced with redundant cells by a memory test and thereby improve the yield, the maximum value of oscillation period can be desirably set at a temperature higher than 0° C.

In such a case, it is preferred to incorporate, in an oscillator circuit, a parallel connection of an inverter having delay circuits different in temperature characteristic so that the oscillation period can take the maximum value at 0° C. or higher.

FIG. 6 is a circuit diagram of the second embodiment.

An oscillator circuit 138 of the second embodiment is different from the first embodiment in the circuit configuration of a first-stage CMOS inverter and the configuration in a second-stage CMOS inverter. However, the other configurations are substantially the same, and hence explanation is made mainly on the different configurations.

Figure 22A:
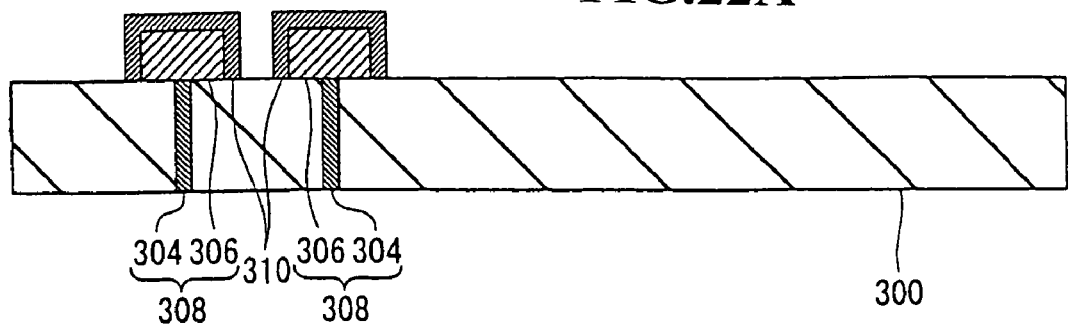
FIGS. 22A, 22B and 22C are processing views in a third manufacturing example for a temperature-dependent resistance element.
Figure 22B:
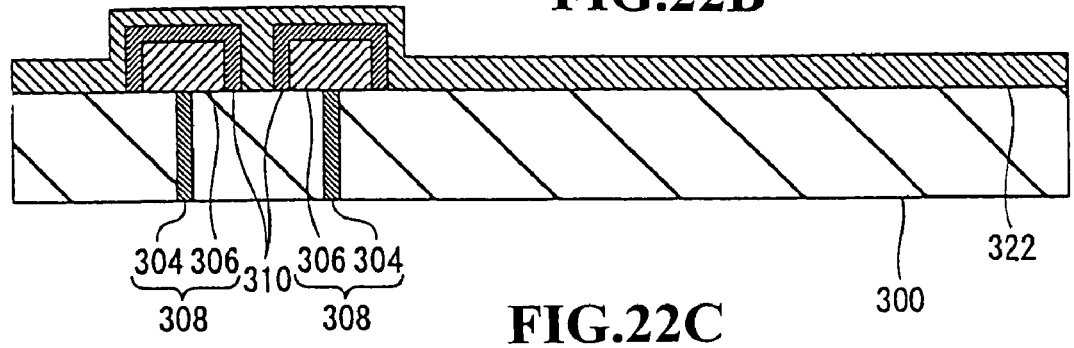
Figure 22C:
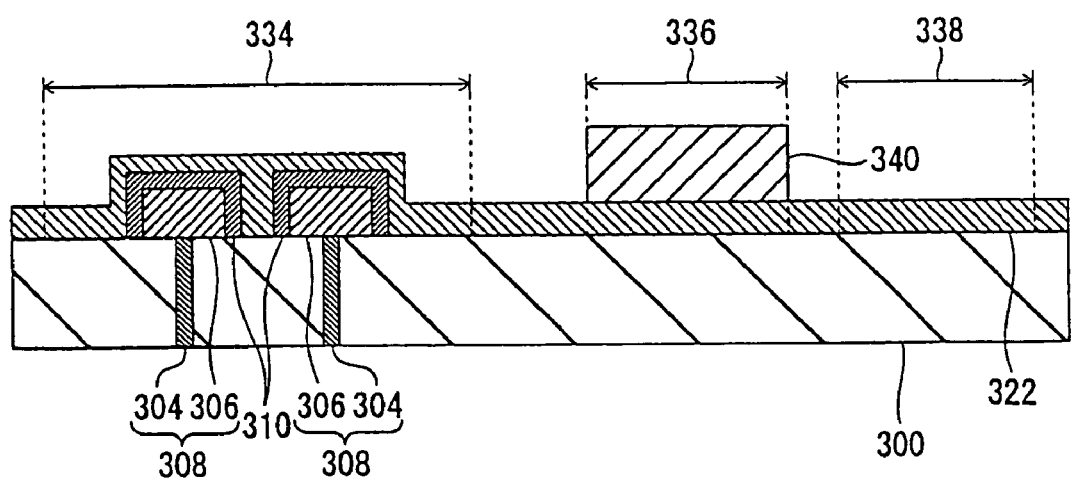

The oscillator circuit 138 is configured by a series connection in a sequential ring form of a first-stage inverter 140 configured by two parallel-connected ones of a first sub-CMOS inverter 142 and a second sub-CMOS inverter 160, an middle-stage three inverters 104*a*, 106 and 108, and a final-stage inverter 110. Incidentally, in the below explanation, the sub-CMOS inverter is also referred merely FIGS. 22A, 22B and 22C are processing yiews in a third manufacturing example for a temperature-dependent resistance element; and to as a sub-inverter. Herein, the middle-stage inverter 104*a* is configured by a logic gate in order to determine an inverter output based on a signal first changed of the outputs of the first sub-inverter 142 and second sub-inverter 160. In this embodiment, this is formed by a NAND circuit 104*a*. The NAND circuit 104*a* has first and second input terminals. The first input terminal is connected to a first first-stage output terminal of the first sub-inverter 142 while the second input terminal is connected to a second first-stage output terminal of the second sub-inverter 160.

The first sub-inverter 142 has a first transistor series circuit 154 having two transistors 144 and 146 different in conductivity type and connected in series at their main current passages, and a first delay circuit 156 connected to the first transistor series circuit 154 and for giving a delay to a first first-stage output signal of the first sub-inverter 142. The first delay circuit 156 is configured by a temperature-dependent resistant element 148 as a first resistance element and a first capacitor 150. In the invention, the first resistance element 148 is inserted and connected on a current passage of the transistor series circuit 154 at between a first output node 157 of the first sub-inverter 142 and a reference voltage terminal. Meanwhile, the first capacitor 150 is connected between the first output node 157 and the reference voltage terminal. Similarly, a second resistance element 168 is inserted and connected on a current passage of a second transistor series circuit 172 at between a second output node 175 of the second sub-inverter 160 and the reference voltage terminal. Meanwhile, a second capacitor 170 is connected between the second output node 175 and the reference voltage terminal.

In the configuration example shown in FIG. 6, the first transistor series circuit 154 in the first sub-inverter 142 is connected between a bias voltage ($V_{DD}$) terminal and a reference voltage ($V_{SS}$) e.g. ground (GND). The first PMOST 144 has one main electrode coupled to the $V_{DD}$ terminal. The other main electrode of the first PMOST 144 is coupled to the other main electrode of the first NMOST 146 through the temperature-dependent resistant element 148. One main electrode of the first NMOST 146 is coupled to the $V_{SS}$ terminal. The first PMOST 144 and the first NMOST 146 have respective gate electrodes connected common by a connection point (node) 152. The temperature-dependent resistance element 148 is connected between a drain electrode, as the other main electrode, of the first PMOST 144 and a drain electrode, as the other main electrode, of the first NMOST 146. The first capacitor 150 is connected between a drain electrode of the first PMOST 144 and the reference voltage ($V_{SS}$) terminal. The first first-stage output terminal of the first sub-inverter 142 is a junction (referred to as a first output node) 157 of a drain electrode of the first PMOST 144, the first resistance element 148 and the first capacitor 150.

The second sub-inverter 160 is configured similarly to the first sub-inverter 142 but different in that the second resistance element 168 is formed by a temperature-nondependent resistance element. The second sub-inverter 160 has a second transistor series circuit 172 having two transistors 164 and 166 different in conductivity type and connected in series at their main current passages, and a second delay circuit 174 connected to the second transistor series circuit 172 and for giving a delay to a second first-stage output signal of the second sub-inverter 160. The second delay circuit 174 is configured by the temperature-nondependent resistance element 168 as the second resistance element and the second capacitor 170.

The second transistor series circuit 172 of the second sub-inverter 160 is connected between the bias voltage ($V_{DD}$) terminal and the reference voltage ($V_{SS}$) terminal, e.g. ground (GND). The second PMOST 164 has one main electrode coupled to the $V_{DD}$ terminal. The other main electrode of the second PMOST 164 is coupled to one main electrode of the second NMOST 166 through the temperature-nondependent resistance element 168. The other electrode of the second NMOST 166 is coupled to the $V_{SS}$ terminal. The second PMOST 164 and the second NMOST 166 have respective gate electrodes common-connected by a connection point (node) 162. The temperature-nondependent resistance element 168 is connected between a drain electrode, as the other main electrode, of the second PMOST 164 and a drain electrode, as the other main electrode, of the second NMOST 166. The second capacitor 170 is connected between the drain electrode of the second PMOST 164 and the $V_{SS}$ terminal. The second sub-inverter 160 has the second first-stage output terminal given by a connection point (referred to as a second output node) 175 of the drain electrode of the second PMOST 164, the second resistance element 168 and the second capacitor 170.

The operation of the oscillator circuit 138 is nearly similar to that of the oscillator circuit 100 of the first embodiment. In the below explanation, high level corresponding to binary "1" is represented by the voltage $V_{DD}$ while low level corresponding to binary "0" is represented by the voltage $V_{ss}$ ($V_{SS}$=0 V because of grounded in this embodiment).

In case a high-level signal is inputted as an input signal $S_T$ to the second input terminal of the NAND circuit 110, a low-level signal $d_5$ is outputted from the NAND circuit 110. Because the low-level signal is conveyed to the nodes 152 and 162, the low-level signal is inputted to the control electrodes of the first and second PMOSTs 144 and 164 and the control electrodes of the first and second NMOSTs 146 and 166. Due to this, the first and second PMOSTs 144 and 164 turn on and the first and second NMOSTs 164 and 166 turn off, to store charge on the first and second capacitors 150 and 170. Simultaneously, first-stage and second-stage output signals $d_{11}$ and $d_{12}$ both at high level are sent from the first and second sub-inverters 142 and 160 to the inverter 104a. A low-level signal $d_2$ is outputted from the inverter 104a and then converted by the inverters 106 and 108 into high-level and low-level output signals $d_3$ and $d_4$ in the order. From the node 112, a low-level signal $d_4$ is outputted to the outside. Simultaneously, the low-level signal is inputted to the first input terminal of the NAND circuit 110. The NAND circuit 110, in a state $S_T$ is at high level, operates similarly to the inverter. It outputs a signal reverse to the signal inputted (low level when high level, high level when low level), without exception. Accordingly, herein a high-level signal $d_5$ is outputted from the NAND circuit 110. From the NAND circuit 110, the high-level signal $d_5$ is inputted to the control electrodes of the first and second PMOSTs 144 and 164 and first and second NMOSTs 146 and 166. This cause the first and second PMOSTs 144 and 164 to turn off and the first and second NMOSTs 146 and 166 turn on, to gradually release the charge stored on the first and second capacitors 150 and 170. By the output signal $d_{11}$ or $d_{12}$ of the first sub-inverter 142 or second sub-inverter 160 having discharged earlier and outputted low level, the NAND circuit 104a is caused to output a high-level signal $d_2$. When the high-level signal $d_2$ is outputted from the NAND circuit 104a, it is changed into low-level and high-level output signals $d_3$, $d_4$ by the inverters 106, 108 in the order, to output a high-level signal $d_4$ from the output node 112 to the outside. Simultaneously, the high-level signal $d_4$ is inputted to the first input terminal of the NAND circuit 110. Because of outputting a low-level signal $d_5$ from the NAND circuit 110, the above operation is repeated. Consequently, high-level and low-level signals are outputted with a constant period to the outside.

Figure 7A:
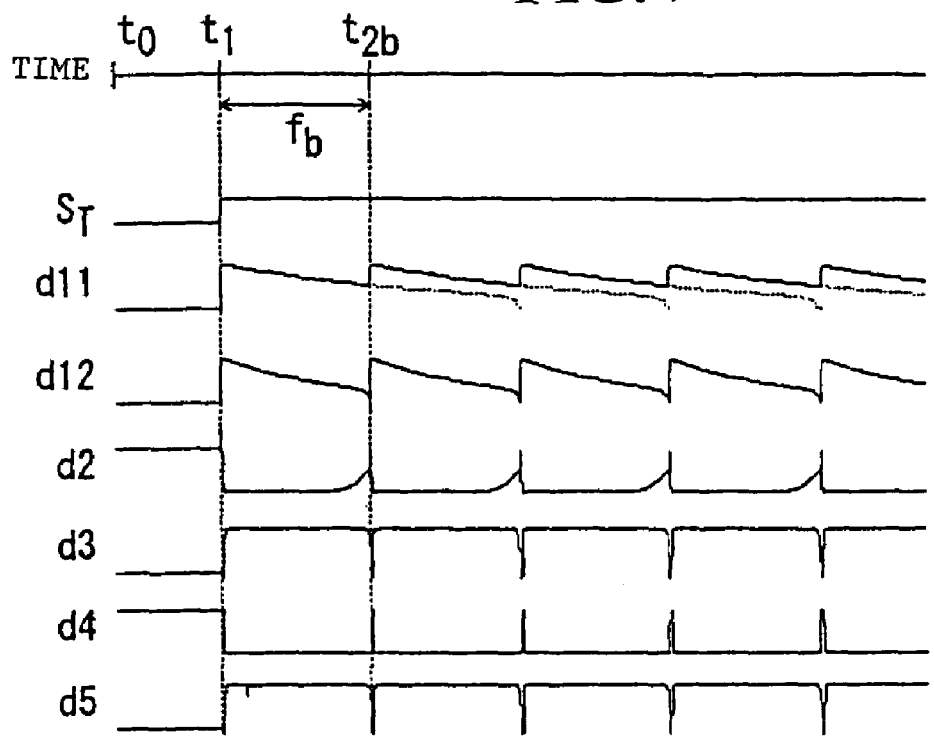
FIGS. 7A and 7B are schematic figures of an operating waveform outputted by the oscillator circuit in the second embodiment.
Figure 7B:
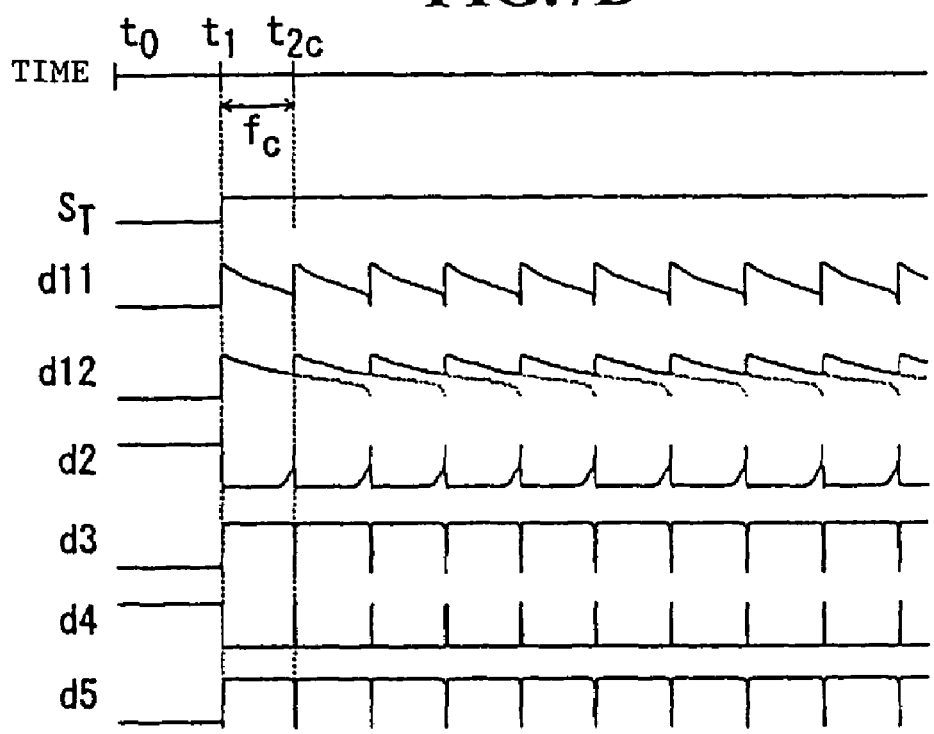

FIGS. 7A and 7B are schematic figures showing an operation waveform by the oscillator circuit 138. FIG. 7A shows an operation waveform in the low temperature region, i.e. in the case that the resistance value of the first resistance element 148 of the first delay circuit 156 is greater than that of the second resistance element 168 of the second delay circuit 174. FIG. 7B shows an operation waveform in the high temperature region, i.e. in the case that the resistance value of the first resistance element 148 of the first delay circuit 156 is smaller than that of the second resistance element 168 of the second delay circuit 174.

In the oscillator circuit 100 explained in the first embodiment, the signal inputted from the first-stage inverter 102 to the inverter 104 was $d_1$ only. In the oscillator circuit 138 of the second embodiment, because the first sub-inverter 142 and the second sub-inverter 160 are connected in parallel, the two, or the first-stage output signal $d_1$ outputted from the first sub-inverter 142 and the second-stage output signal $d_{12}$ outputted from the second sub-inverter 160, are inputted to the NAND circuit 104a. In case any one of the signals $d_{11}$ and $d_{12}$ becomes low level, the NAND circuit 104a outputs a high-level signal $d_2$. This timing determines an oscillation period for the oscillator circuit 138.

In the low temperature region, because the resistance value of the temperature-dependent resistance element 148 is greater than the resistance value of the temperature-nondependent resistance element 168, the output signal $d_{12}$ of the second sub-inverter 160 first reaches from high level to low level. Accordingly, an oscillation period is determined by the output signal $d_{12}$, and the output signal $d_{11}$ of the first sub-inverter 142 again becomes high level before reaching low level. Based on the output signal $d_{12}$ of the second sub-inverter 160, the NAND circuit 104a outputs a signal $d_2$, in which timing are determined output signals $d_3$ and $d_4$ of the inverters 106 and 108. Accordingly, assuming that high level is inputted to the input signal $S_T$ at time $t_1$, the time required, up to a time $t_{2b}$, for the output signal $d_{12}$ of the second inverter 160 to reach low level provides an oscillation period $f_b$.

In the high temperature region, because the resistance value of the temperature-dependent resistance element 148 of the first sub-inverter 142 is smaller than the resistance value of the temperature-nondependent resistance element 168 of the second sub-inverter 160, the output signal $d_{11}$ of the first sub-inverter 142 first reaches from high level to low level. Accordingly, an oscillation period is determined by the output signal $d_{11}$, and the output signal $d_{12}$ of the second sub-inverter 160 again becomes high level before reaching low level. Based on the output signal $d_{11}$ of the first sub-inverter 142, the NAND circuit 104a outputs a signal $d_2$, in which timing are determined output signals $d_3$ and $d_4$ of the inverters 106 and 108. Accordingly, assuming that high level is inputted to the input signal $S_T$ at time $t_1$, the time required, up to a time $t_{2c}$, for the output signal $d_{11}$ of the first sub-inverter 142 to reach low level provides an oscillation period $f_c$.

FIG. 8 is a graph of temperature characteristic representing the relationship between an oscillation period and a temperature.

The horizontal axis represents a temperature (unit: ° C.) while the vertical axis represents a logarithm value of a relative value when the oscillation period at 80° C. is taken 1.

In the high temperature region, because oscillation period is determined by the first sub-inverter 142, oscillation period shortens with increasing temperature. In the low temperature region, because the resistance value of the temperature-dependent resistance element 148 becomes greater than the resistance value of the temperature-nondependent resistance element 168. Because oscillation period is determined by the second sub-inverter 160, it is given a constant oscillation period. This constant oscillation period provides the maximum value of oscillation period. By combining the resistance values of the temperature-dependent resistance element 148 and temperature-nondependent resistance element 168, adjustment is possible as to at what temperature or lower the oscillation period is given a constant maximum value. Accordingly, if adapted to reach the maximum value at a temperature higher than 0° C., there is no need of a memory test at a temperature equal to or lower than 0° C. Meanwhile, in the high temperature region, the temperature-dependent resistance element is determined in resistance value such that periodic change is made to the DRAM temperature characteristic. This enables adjustment to the oscillation period suited for a refresh period required by the DRAM.

According to the oscillator circuit of the second embodiment, there is no need of setting at 0° C. or lower during conducting a memory test, thus eliminating the need for an expensive apparatus. Meanwhile, because the maximum value of oscillation period is decreased, the total test time required for a memory test can be also shortened.

Meanwhile, the change rate in the usual service temperature range (0–80° C.) can be taken great in magnitude without increasing the maximum value of oscillation period. Accordingly, it is possible to reduce the memory cells in the number to be replaced with redundant cells during a memory test. Hence, yield can be improved.

[Third Embodiment]

In a third embodiment of the invention, there are included a first oscillation-period determining circuit and a second oscillation-period determining circuit. Explanation is made on the example having an oscillation-period determining device for outputting, as a final output, an output signal having a shorter oscillation period of the two output signals outputted by the two oscillation-period determining circuits.

The temperature-dependent resistance element in many cases involves the variations from product to product, as compared to the temperature-nondependent resistance element. In such a case, there is a need to adjust an oscillation period outputted by the oscillator circuit. The resistance-value adjusting method for a temperature-dependent resistance element is different from the ordinary adjusting method for a temperature-nondependent resistance element. For the resistance value of a usual resistance element, i.e. a temperature-nondependent resistance element, the magnitude of resistance value is adjusted based upon the length of current conduction. The temperature-dependent resistance element is adjusted based on an energization width instead of a resistance element length, because it is greater in specific resistance by 5–7 orders of magnitude as compared to the usual resistance element. In order to make this adjustment, a plurality of spare resistance elements are provided in advance so that the number of the spare resistance elements for current conduction can be changed, i.e. the resistance element width is adjusted to thereby obtain a required resistance value. In order to adjust the oscillation period only by the resistance value magnitude of a resistance element in this manner, there is a need to provide spare resistance elements. Due to this, there encounters an increase of the area where the resistance element occupies on the circuit. This is disadvantageous semiconductor device integration.

On the contrary, the on-circuit occupation area of the frequency divider requires quite small as compared to the occupation area of resistance element. Thus, there is known a method that the oscillation period outputted by the oscillator circuit is frequency-divided by a frequency divider circuit and adjusted into a desired oscillation period. For example, in JP-A-11-185469, a fuse circuit is provided as period adjusting means for a frequency divider circuit, to use the fuse provided in the fuse circuit in a connected or disconnected state, thereby adjusting for frequency-dividing period. The connection and disconnection states correspond to on and off states.

However, for example, in case period is measured at 80° C. to connect a frequency divider circuit adjusted for a required final oscillation period (oscillation period finally outputted from the oscillator circuit through the frequency divider circuit) at 80° C., then the final oscillation period at low temperature (e.g. 0° C.) is changed therewith.

Accordingly, in such a case, it is preferred to separately prepare an oscillator circuit having an oscillation period dependent upon temperature and an oscillator circuit having an oscillation period not dependent upon temperature and then to connect frequency divider circuits to the respective ones so that, by connecting the two oscillation-period determining circuits thereof to a logic gate, an output signal short in oscillation period can be outputted as the final output signal. In this embodiment, this logic gate is configured by a NAND circuit. Meanwhile, the final output signal is used also as a reset signal for this circuit overall, i.e. the oscillation-frequency determining device.

This embodiment provides, as a first oscillation-period determining circuit, an oscillation-period determining circuit connecting together a first oscillator circuit having an oscillation period dependent upon temperature and a first frequency divider circuit having frequency-dividing period adjusting means. Meanwhile, this embodiment provides, as a second oscillation-period determining circuit, the oscillation-period determining circuit connecting together a second oscillator circuit having an oscillation period not dependent upon temperature but nearly constant and a second frequency divider circuit (not requiring frequency-dividing period adjusting means). In this invention, these two oscillation-period determining circuits are connected to a NAND circuit, thereby configuring an oscillation-period determining device for determining the final output period. The output of the oscillation-period determining device is preferably used for DRAM refresh period. Note that, in the below explanation, there are cases that the oscillation-period determining circuit is referred merely to as a period determining circuit while the frequency-dividing period adjusting means is merely to as period adjusting means.

Figure 9:
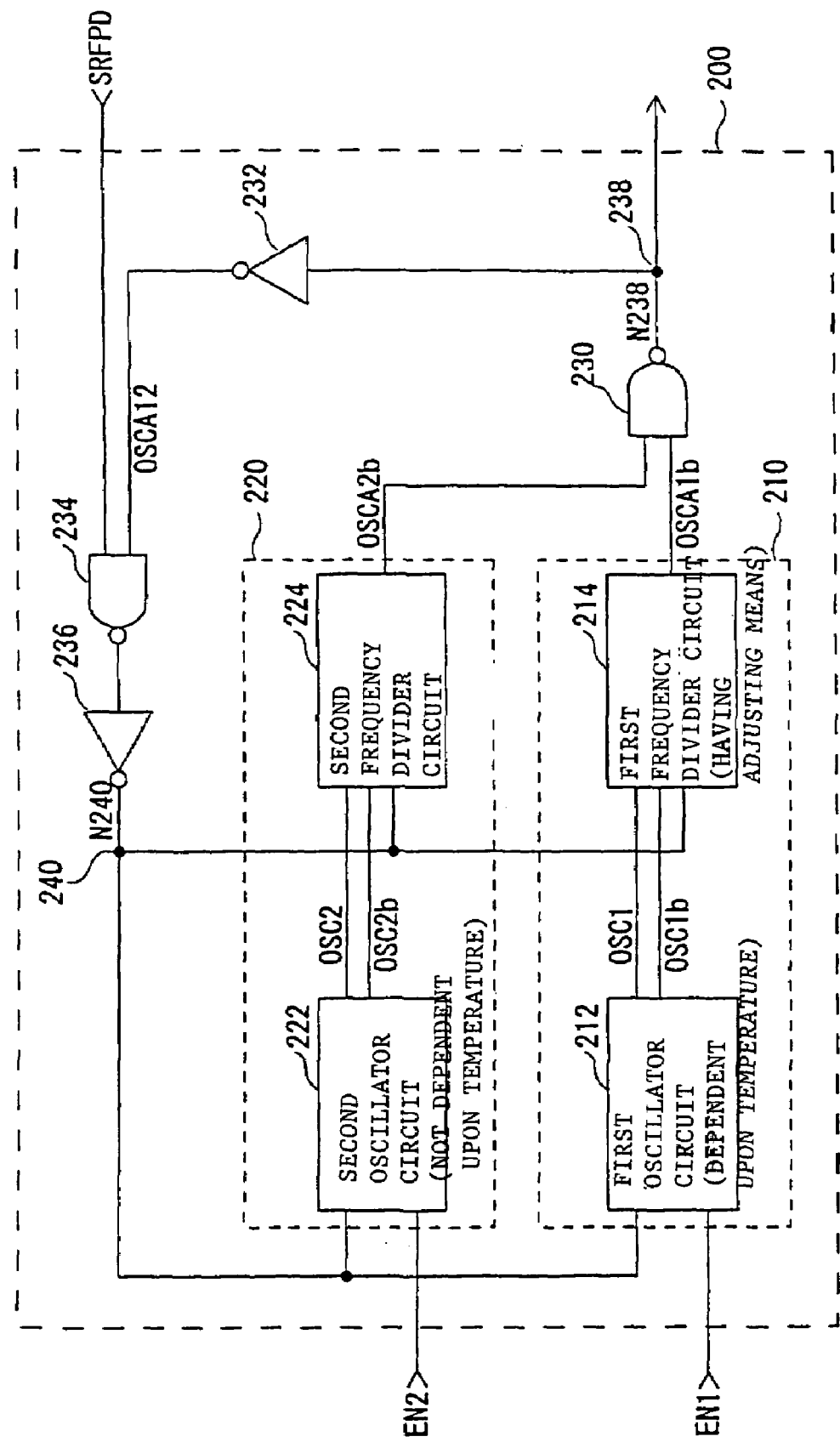
FIG. 9 is a circuit diagram of a period determining circuit in a third embodiment.

FIG. 9 is a circuit diagram showing an oscillation-period determining device in the third embodiment.

A first period determining circuit 210 is configured by an oscillator circuit (first oscillator circuit) 212 dependent upon temperature and a frequency divider circuit 214 for frequency-dividing and adjusting an oscillation period outputted from the first oscillator circuit 212. This frequency divider circuit 214, having adjusting means for frequency-dividing period, is hereinafter referred to as a first frequency divider circuit 214. Meanwhile, a second period determining circuit 220 is configured by an oscillator circuit (second oscillator circuit) 222 not dependent upon temperature and a frequency divider circuit 224 for frequency-dividing an oscillation period outputted by the oscillator circuit 222. This frequency divider circuit 224, not having adjusting means for frequency-dividing period, is hereinafter referred to as a second frequency divider circuit 224. The reason of not having adjusting means on the second frequency divider circuit 224 is because of no necessity of providing the same due to less manufacture variation in the temperature-nondependent resistance element of the oscillator circuit 222.

The period determining circuits 210 and 220 are connected to a circuit for comparing the outputs of the two period determining circuits and outputting the shorter one of the outputted periods, e.g. herein to the respective first and second input terminals of a NAND circuit 230. The output signal of the NAND circuit 230 is inputted to an inverter 232. Simultaneously, the signal is outputted to the outside and utilized for DRAM self refresh-period. An NAND circuit 234 has a first input terminal to which an output signal of the inverter 232 is inputted. The NAND circuit 234 has a second input terminal connected with an external input terminal. The external terminal of the NAND circuit 234 is inputted by an input signal SRFPD for on-off controlling the oscillation-period determining device 200. When the input signal SRFPD is at high level, the oscillation-period determining device 200 is turned on. The NAND circuit 234 has an output signal to be connected to an inverter 236. The inverter 236 has an output signal to be connected, as a reset signal N240, to the first oscillator circuit 212, the first frequency divider circuit 214, the second oscillator circuit 222 and the second frequency divider circuit 224. The external two input signals EN1 and EN2 are to input a bias voltage $V_{DD}$ to the first and second oscillator circuits 212 and 222.

Figure 10:
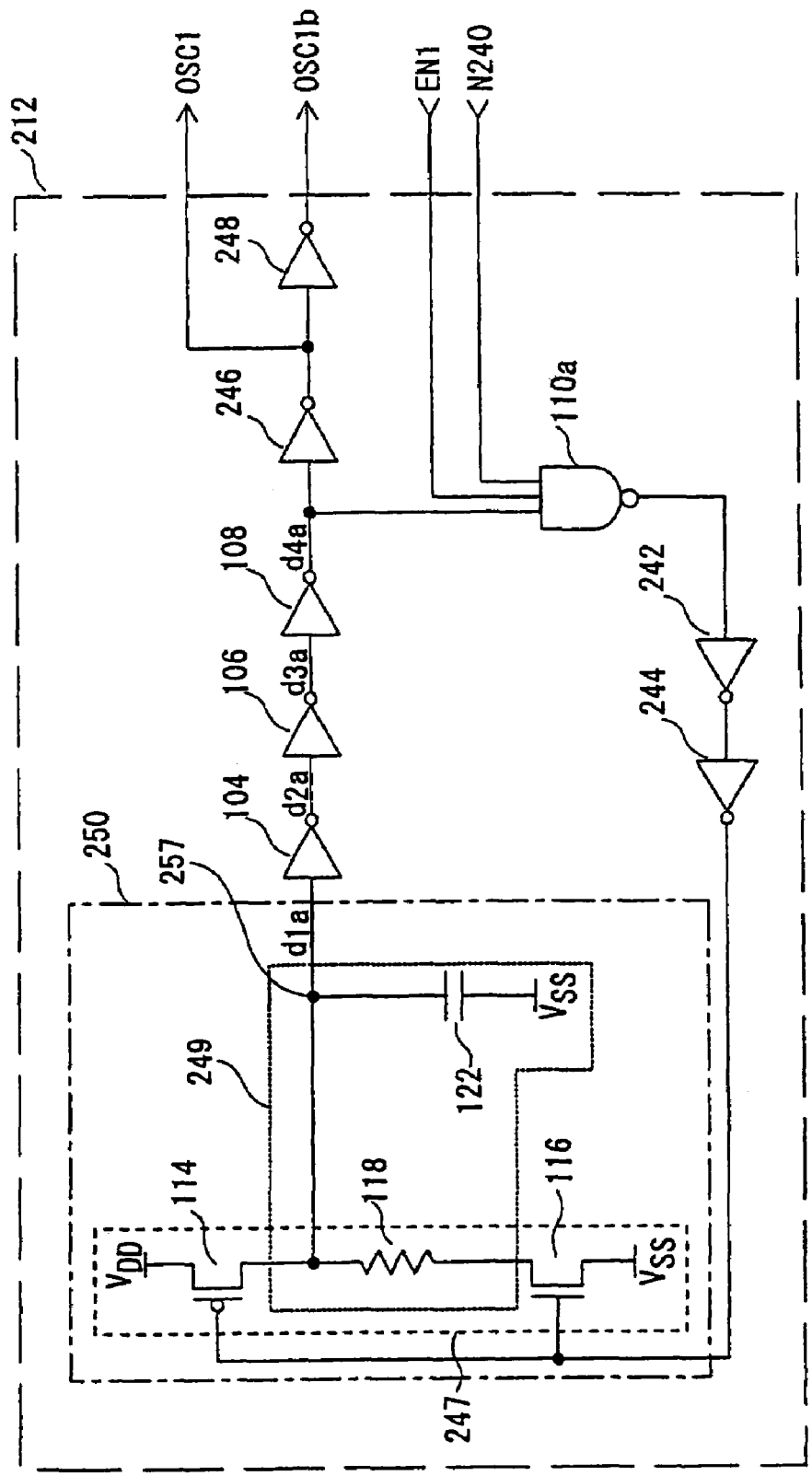
FIG. 10 is a circuit diagram of an oscillator circuit having an oscillation period dependent upon temperature, in the third embodiment.

FIG. 10 is a circuit diagram example of an oscillator circuit (first oscillator circuit) dependent upon temperature, in the third embodiment.

The first oscillator circuit 212 is configured by a series connection in a sequential ring form of a first-stage inverter 250, three middle-stage inverters 104, 106 and 108 and a final-stage inverter 110a. Herein, an inverters 242 and 244 are connected between the NAND circuit 110a as the final-stage inverter and the inverter 250. The two inverters 242 and 244 are connected as buffer circuits. However, in the case the inverters in the total number are series connected in an odd-numbered ring form (seven in this case), they operate as a ring oscillator circuit and not essentially required in design.

The final-stage inverter 110a is configured by a NAND circuit having first, second and third input terminals, in order to connect the first oscillator circuit 212 to an outside. The first input terminal is connected to the output terminal of the previous-stage inverter 108. An external input signal EN1 is inputted to the second input terminal of the NAND circuit 110a. A reset signal N240 is inputted to the third input terminal. In case a high-level signal is inputted as the signal EN1, the first oscillator circuit 212 in this state is in an on-state. When a high-level signal is inputted as the reset signal N240, the NAND circuit 110a outputs a low-level signal. This resets the first oscillator circuit 212.

The first-stage inverter 250 has a circuit configuration equivalent to the first sub-CMOS inverter 142 of the second embodiment explained with reference to FIG. 6. Namely, the first-stage inverter 250 has a first transistor series circuit 247 having two transistors 114 and 116 different in conductivity type and connected in series at their main current passages, and a first delay circuit 249 connected to the first transistor series circuit 247 and for giving a delay to an output signal of the inverter 250. The first delay circuit 249 is configured by a temperature-dependent resistance element 118 as a first resistance element and a first capacitor 122.

Herein, the constituent elements of the first-stage inverter 250 and the constituent element of the first sub-CMOS inverter 142 have the corresponding relationship as follows. The first PMOST 114 corresponds to the same 144, the first NMOST 116 to the same 146, the first transistor series circuit 247 to the same 154, the first resistance element 118 to the same 148, the first capacitor 122 to the same 150, the first delay circuit 249 to the same 156, and a first output node 257 to the same 157. Accordingly, the circuit configuration and operation of the first-stage inverter 250 is similar to that of the first sub-CMOS inverter 142 shown in FIG. 6. Hence, explanation is omitted of the same elements.

The inverter 108 outputs a signal to an inverter 246, and the inverter 246 outputs a signal as an oscillation signal OSC1. An inverter 248 connected to the inverter 246 outputs an inverted oscillation signal OSC1b as an inversion to the oscillation signal OSC1. The NAND circuit 110a has the second input terminal always inputted by the $V_{DD}$ signal, and the third input terminal to be inputted by a reset signal N240.

In this first oscillator circuit 212, the first delay circuit 249 having the temperature-dependent resistance element 118 changes an oscillation period to be outputted. At high temperature, because the temperature-dependent resistance element 118 has a decreased resistance value, the oscillation period is shortened. At low temperature, because the temperature-dependent resistance element 118 has an increased resistance value, the oscillation period is prolonged.

Figure 11:
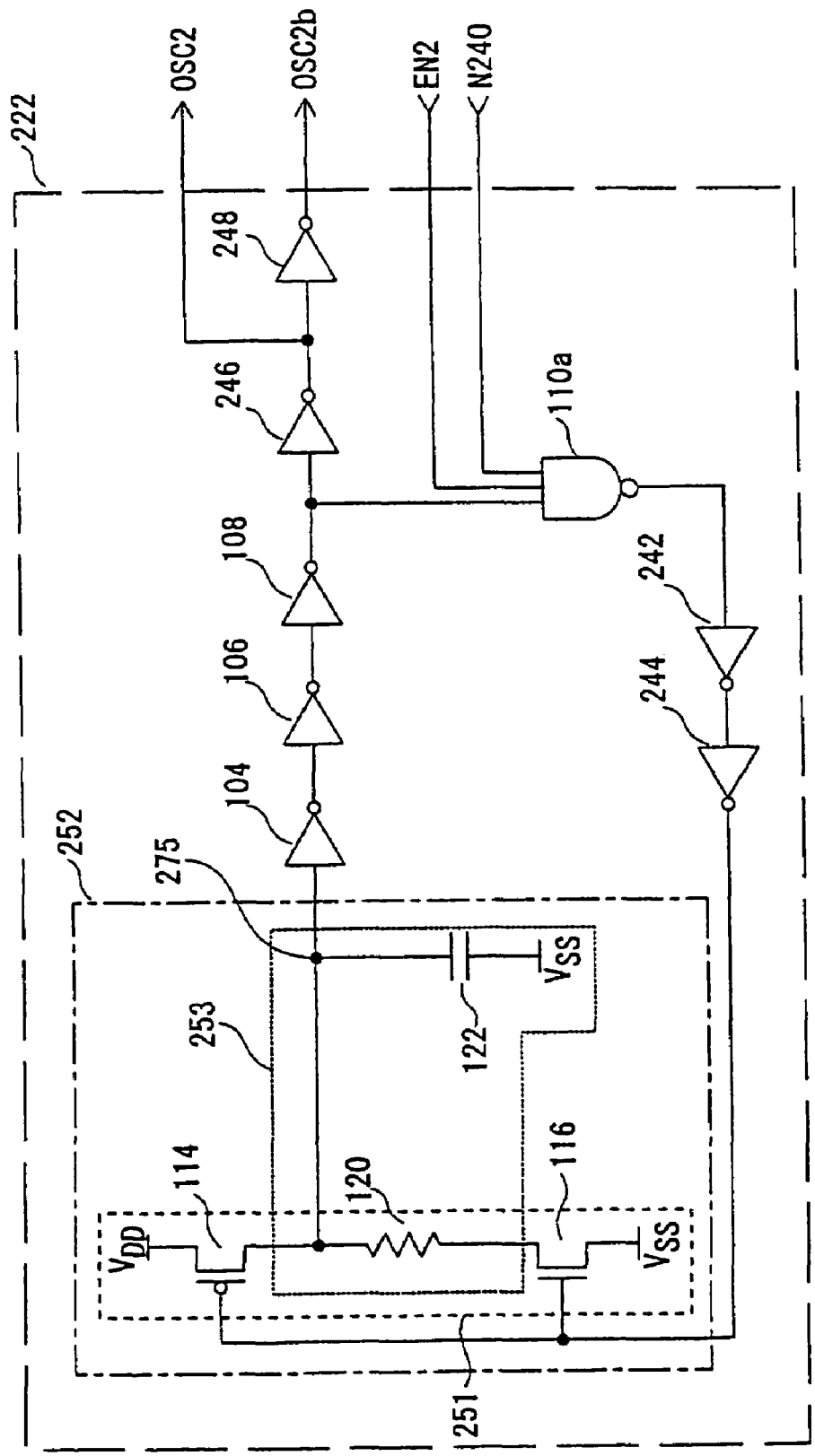
FIG. 11 is a circuit diagram of an oscillator circuit having an oscillation period not dependent upon temperature, in the third embodiment.

FIG. 11 is a circuit diagram example of an oscillator circuit (second oscillator circuit) not dependent upon temperature, in the third embodiment.

The second oscillator circuit 222 shown in FIG. 11 is different in circuit configuration from the first oscillator circuit 212 of FIG. 10 in that a second delay circuit 253 uses a temperature-nondependent resistance element 120 as a second resistance element, the other circuit configuration being the same.

Meanwhile, a first-stage inverter 252 configuring the second oscillator circuit 222 shown in FIG. 11 has an equivalent circuit configuration to the second sub-CMOS inverter 160 of the second embodiment explained with reference to FIG. 6. The constituent elements of the first-stage inverter 252 and the constituent element of the second sub-CMOS inverter 160 have the corresponding relationship as follows. A second PMOST 114 corresponds to the same 164, a second NMOST 116 to the same 166, a second transistor series circuit 251 to the same 172, the second resistance element 120 to the same 168, a second capacitor 122 to the same 170, the second delay circuit 253 to the same 174, and a second output node 275 to the same 175. Accordingly, the circuit configuration and operation of the first-stage inverter 252 and second oscillator circuit 222 is similar to that of the first oscillator circuit 212 shown in FIG. 10 removed of the constituent elements of the second sub-CMOS inverter 160 shown in FIG. 6 and first-stage inverter 252. Hence, explanation is omitted of the same elements.

In the second oscillator circuit shown in FIG. 11, because the temperature-nondependent resistance element 120 has nearly a constant resistance value, the output of the first-stage inverter 252 does not vary depending upon temperature, i.e. nearly constant. Accordingly, the output signal of the second oscillator circuit 222, i.e. oscillation signal OSC2 and OSC2b, does not vary depending upon temperature. Thus, a nearly constant period is to be outputted.

Figure 12:
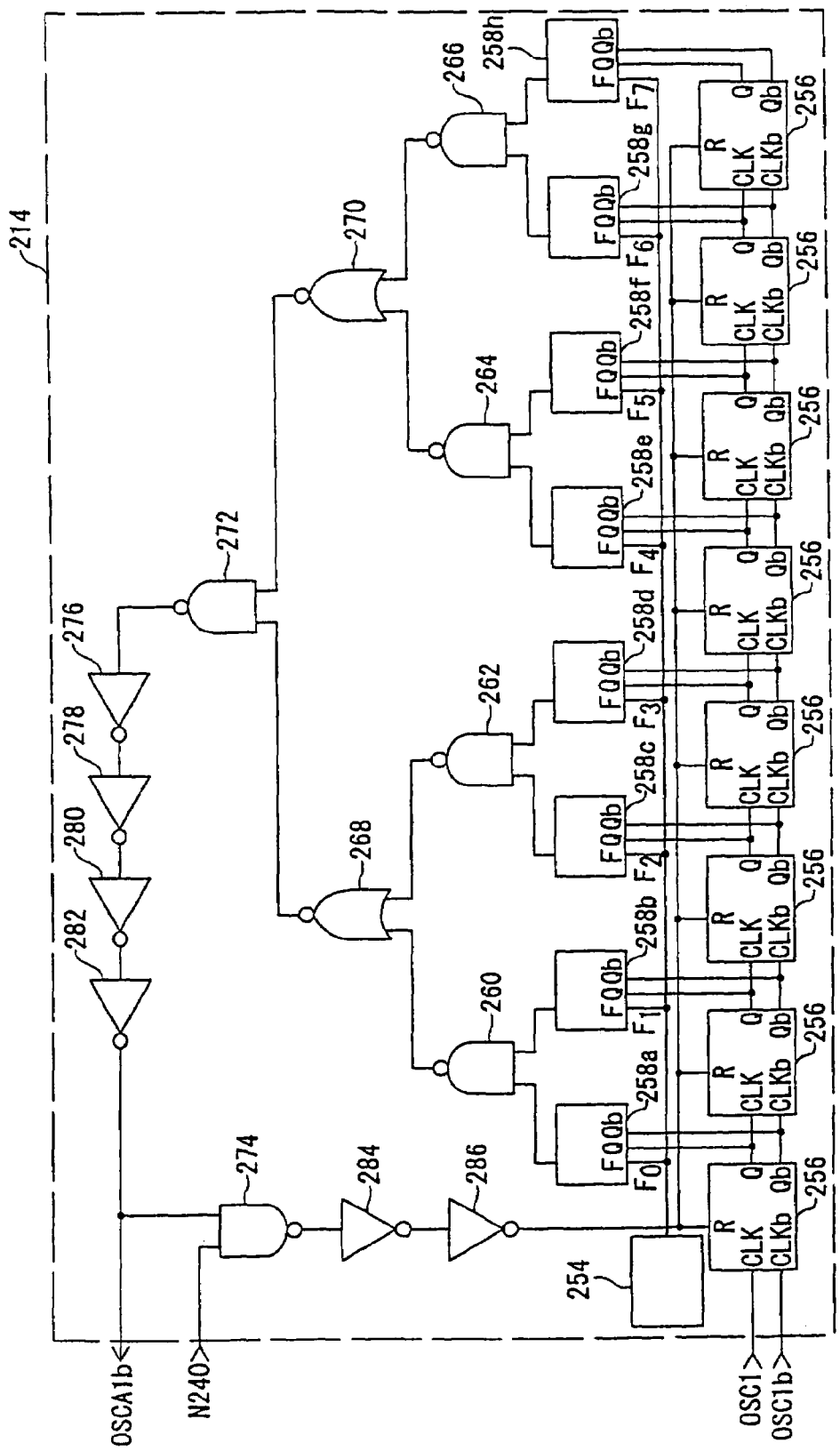
FIG. 12 is a circuit diagram of a frequency divider circuit having adjusting means, in the third embodiment.

FIG. 12 is a circuit diagram showing a configuration example of the first frequency divider circuit 214 in the third embodiment. This first frequency divider circuit 214 is connected with eight frequency halving circuits 256. A fuse circuit 254 is adjusting means for the frequency-dividing period by the first frequency divider circuit 214. The output signals of the frequency halving circuits 256 are respectively compared with the signals $F_0$–$F_7$ (representatively shown Fx) of from the fuse circuit 254. The outputs are selected by a NAND circuit and a NOR circuit, to thereby determine a frequency-dividing period. Accordingly, the first frequency divider circuit 214 outputs an oscillation signal OSCA1b adjusted in oscillation period.

Now, explanation is briefly made on one circuit configuration example of the first frequency divider circuit shown in FIG. 12.

The first frequency divider circuit 214 has input terminals to be inputted by mutually inverted signals OSC1 and OSC1b, an input terminal to be inputted by a reset signal N240, and an output terminal for outputting an oscillation signal OSCA1b of adjusted in oscillation period. Each frequency halving circuit 256 has two input terminals CLK and CLKb to be respectively inputted by inversion-related input signals, two output terminals Q and Qb for outputting inversion-related output signals, and a reset terminal R for resetting the frequency halving circuit. The eight frequency halving circuits 256 is connected in series from the first over to final stages. Signals OSC1 and OSC1b are respectively inputted to the input terminals CLK and CLKb of the first-stage frequency halving circuit 256. The previous-stage output terminals Q and Qb are respectively connected to the next-stage input terminals CLK and CLKb.

Switch circuits 258a–258h are provided corresponding one-to-one to the frequency halving circuit 256. Each switch circuit 258a–258h has two input terminals Q and Qb connected to the output terminal Q and Qb of the corresponding frequency divider circuit 256, an input terminal F to be inputted by an adjusting signal Fx for adjusting the frequency-dividing period from the fuse circuit 254, and one output terminal. This adjusting signal Fx comprises the signals $F_0$–$F_7$ having values corresponding to the switch circuits 258a–258h. Meanwhile, although the fuse circuit and the switch circuits in FIG. 12 are shown as common connection, the fuse circuit 254 and the switch circuits 258a–258h in actual are individually connected to input the signals $F_0$–$F_7$ to the corresponding switch circuits 258a–258h. The switch circuit 258a–258h outputs signals Q and Qb depending upon the timing relationship of the period adjusting signal Fx and the output signal Q and Qb of the frequency divider circuit 256. The successive two switch circuits 258a and 258b, 258c and 258d, 258e and 258f, and 258g and 258h have output terminals respectively connected to the two input terminals of the respective NAND circuits 260, 262, 264 and 266. The successive two NAND circuits 260 and 262, and 264 and 266 have output terminals respectively connected to two input terminals of the respective NOR circuits 268 and 270. The NOR circuits 268 and 270 have output terminals respectively connected to two input terminals of a NAND circuit 272.

The NAND circuit 272 has an output terminal connected to a terminal for outputting a signal OSCA1b, through inverters 276, 278, 280 and 282 connected in series in the order, and connected to one input terminal of a NAND circuit 274. The NAND circuit 274 has the other input terminal connected to input a reset signal N240.

The NAND circuit 274 has an output terminal connected common to the reset terminals R of the frequency divider circuits through inverters 284 and 286 connected in series in the order.

The foregoing inverters 276, 278, 280, 282, 284 and 286 are buffer circuits and may be suitably provided in design. The NAND circuit 274 is provided to input a reset signal N240. By the reset signal N240, the frequency divider circuit 214 is reset.

Figure 13:
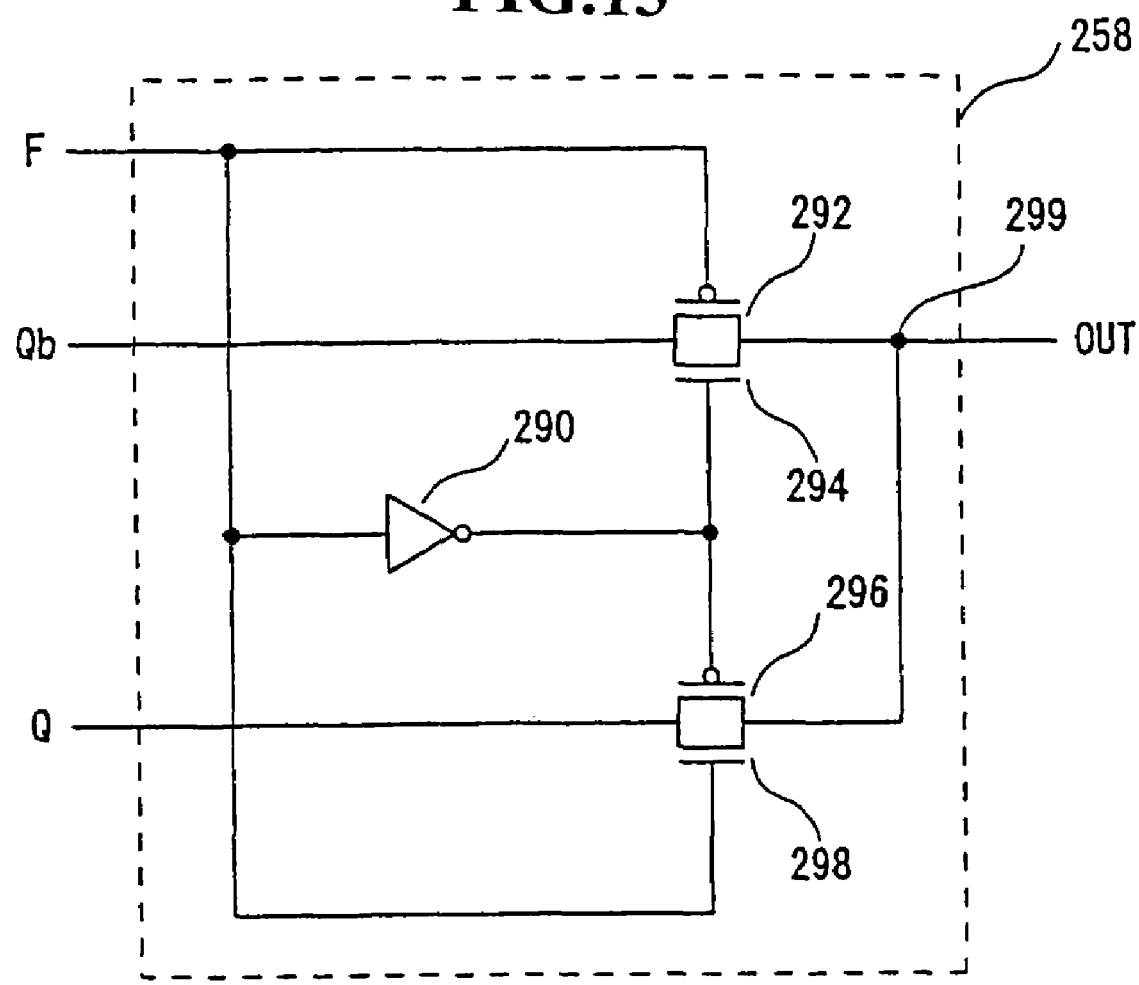
FIG. 13 is a circuit diagram of a switch circuit in the third embodiment.

FIG. 13 is a circuit diagram showing one configuration example of the switch circuit of the first frequency divider circuit 214.

The switch circuits 258a–258h are explained as a common switch circuit 258 because of having the same circuit configuration. In this switch circuit 258, a PMOST 292 and an NMOST 294 are connected in parallel. Similarly, a PMOST 296 and an NMOST 298 are connected in parallel. The PMOST 292 and the NMOST 298 have gate electrodes connected common to an input terminal F and to an input terminal of an inverter 290. The NMOST 294 and the PMOST 296 have gate electrodes connected common to an output terminal of the inverter 290. The PMOST 292 and the NMOST 294 have parallel-connected main current passages connected between an output terminal OUT of the switch circuit 258 (i.e. connection point (node) 299) and the input terminal Qb. The PMOST 296 and the NMOST 298 have parallel-connected main current passages connected between the output terminal OUT and the input terminal Q.

Through the input terminals Q and Qb, respectively inputted are the output signal Q and Qb from the frequency halving circuit 256. When an input signal $F_0$–$F_7$ is inputted at the input terminal F from the fuse circuit 254, either one signal of Q or Qb is outputted from the switch circuit 258. The signal $F_0$–$F_7$ from the fuse circuit 254 provides inputs different in value between the switching circuits 258a–258h. For example, the signal $F_0$ is inputted to the switch circuit 258a and the signal $F_1$ is to the switch circuit 258b, in the order. Accordingly, the frequency-dividing period for the frequency divider circuit 214 is determined according to the signal $F_0$–$F_7$ from the fuse circuit 254.

Figure 14:
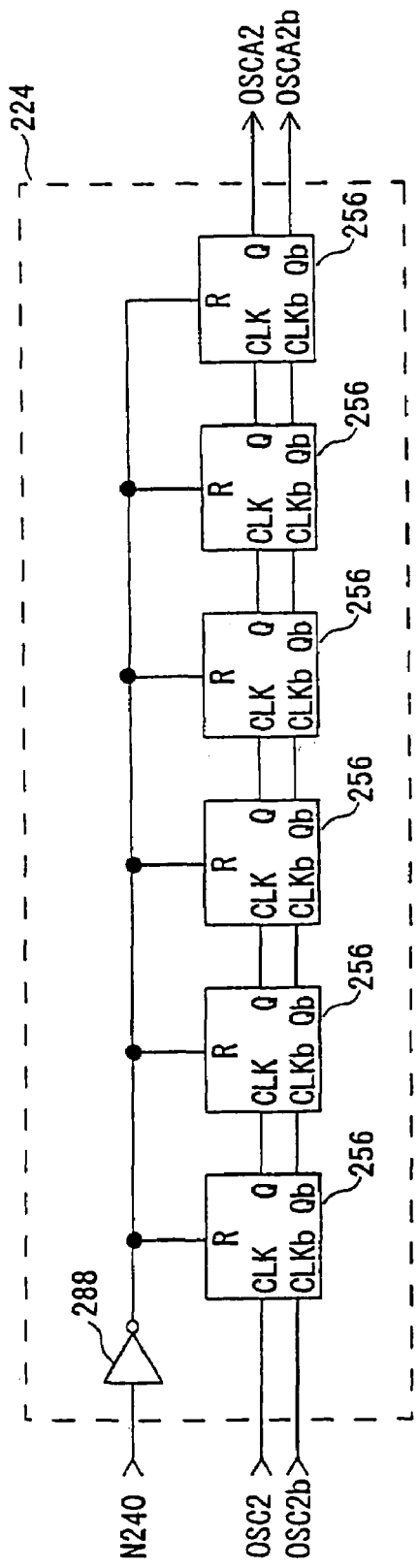
FIG. 14 is a circuit diagram of a frequency divider circuit not having adjusting means, in the third embodiment.

FIG. 14 is a circuit diagram showing one configuration example of the second frequency divider circuit 224.

This second frequency divider circuit 224 is connected with six frequency halving circuits 256 to thereby output an oscillation period frequency-divided by 2 to the 6-th power or by 64. The frequency divider circuit 224 has two input terminals for the oscillation signals OSC2 and OSC2b mutually in an inversion relationship, an input terminal for a reset signal N240, and two output terminals for outputting the oscillation signals OSCA2 and OSCA2b mutually in an inversion relationship. Furthermore, in the second frequency divider circuit 224, the six frequency halving circuits 256 are connected in series, similarly to those of the first frequency divider circuit 214. The frequency halving circuit 256 in the second frequency divider circuit 224 has a circuit configuration similar to that of the frequency halving circuit 256 of the first frequency divider circuit 214. In the second frequency divider circuit 224, a reset input terminal for a reset signal N240 is connected common to the reset terminals R of the frequency halving circuits 256, through an inverter 288. The first-stage frequency halving circuit 256 of the second frequency divider circuit 224 has input terminals CLK and CLKb respectively connected to input terminals OSC2 and OSC2b. The final-stage frequency halving circuit 256 has output terminals Q and Qb respectively connected to output terminals OSCA2 and OSCA2b. The output terminals Q and Qb of the previous-stage frequency halving circuit are respectively connected to the input terminals CLK and CLKb of the next stage.

In case an oscillation signal OSC2 and OSC2b outputted from the second oscillator circuit 222 is inputted to the second frequency divider circuit 224, each frequency halving circuit 256 makes outputting with a double period. Thus, 64 frequency division is done through the six frequency halving circuits. The second frequency divider circuit 224 has, as an output signal, an oscillation signal OSCA2 and OSCA2b having a period 64 times the period of the inputted oscillation signal OSC2 and OSC2b. The second frequency divider circuit 224 is reset by the signal N240.

Figure 15:
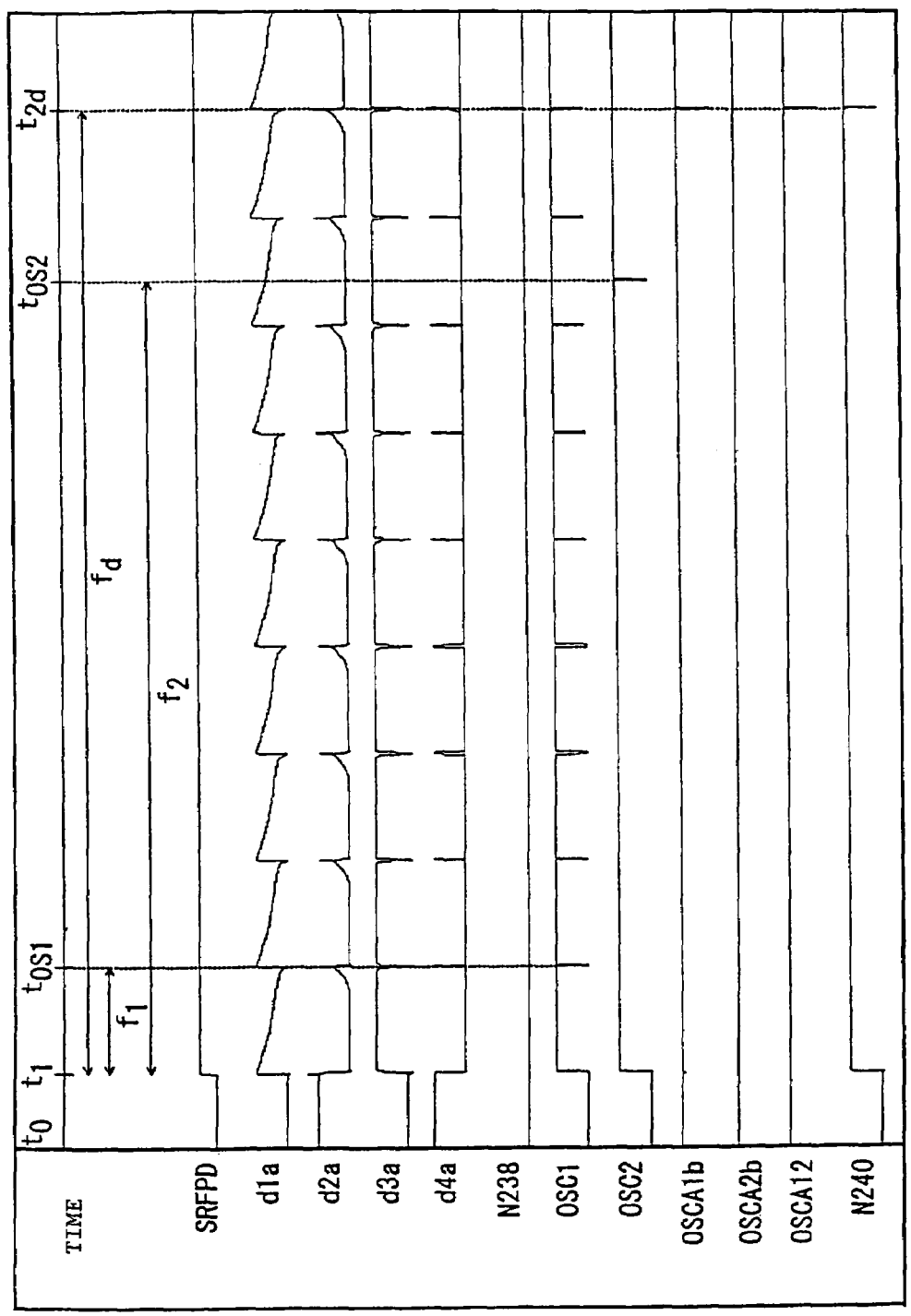
FIG. 15 is a schematic figure of an operating waveform outputted by a period determining circuit in the third embodiment.

FIG. 15 is a schematic diagram of an operating waveform on the oscillation-frequency determining device 200.

By inputting a high-level signal to the input terminal SRFPD, a reset signal N240 is inputted to the oscillator circuit 212 having an oscillation period dependent upon temperature, the oscillator circuit 222 having an oscillation period not dependent upon temperature, and the frequency divider circuits 214 and 224. $d_{1a}$–$d_{4a}$ are the output signals of the delay circuit 249 of the oscillator circuit 212, and the inverters 104, 106 and 108, in the order. N238 represents an output signal of the NAND circuit 230 connected with the two period determining circuits. OSC1 is the output signal of the oscillator circuit 212 while OSC2 is the output signal of the oscillator circuit 222. OSCA1b is the output signal of the frequency divider circuit 214 while OSCA2b is the output signal of the frequency divider circuit 224. OSCA12 is the output signal of the inverter 232 that the output of the NAND circuit 230 is inputted to the inverter 232. N240 is the output signal that the output of the NAND circuit 234 inputted by signals SRFPD and OSCA12 is inverted by the inverter 236, which is used as a reset signal.

This operating waveform diagram illustrates the case that oscillation period is shorter on the oscillator circuit having a temperature-dependent resistance element 118 in a high temperature region. Meanwhile, for easier understanding the figure, the frequency divider circuit 214 is set with a frequency-dividing period as short as 9 frequency division by fuse adjustment.

In case the signal SRFPD becomes high level at time $t_1$, the signals $d_{1a}$, $d_{3a}$ assume high level and the signals $d_{2a}$, $d_{4a}$ assume low level. The first capacitor 122 is gradually released of charge and turned into low level, the signals $d_{2a}$, $d_{3a}$ and $d_{4a}$ are inverted. This is repeated to thereby output an oscillation period.

Assuming that the signal $d_{1a}$ reaches low level at a time $t_{OS1}$, the time $f_1$ so far required provides an oscillation period for the first oscillator circuit 212. This oscillation period is inputted as an oscillation signal OSC1 to the first frequency divider circuit 214. Because the first frequency divider circuit 214 makes 9 frequency divisions, the first low-level signal appears in a time $t_{2d}$ nine times the time required from $t_1$ to $t_{OS1}$, thus outputting a signal OSCA1b with a period $f_d$ 9 times $f_1$. In the example shown in FIG. 15, the output signal OSC2 of the second oscillator circuit 222 has an oscillation period approximately 7.3 times that of the signal OSC1, and made 64 frequency divisions by the second frequency divider circuit 224. Accordingly, the OSCA2b stays at high level without change even once within the range shown in FIG. 15. Depending upon a signal assuming low level in earlier timing of the signals OSCA1b and OSCA2b, a signal N238 is outputted. This signal N238 becomes a high-level signal at a time $t_{2d}$. The signal N238 is outputted as a finally determined period to the outside. The signal N238 is changed by the inverter into a signal OSCA12. By the signal OSCA12 and the signal SRFPD, a signal N240 is outputted and used as a reset signal.

At low temperature, the output signal OSCA1b from the first period determining circuit 210 has an output period longer than the output period of the output signal OSCA2b of from the second period determining circuit 220. Consequently, the period of N238 is determined by the output signal OSCA2b of the second period determining circuit 220. Accordingly, the relationship between temperature and oscillation period is similar to that of the second embodiment.

In the third embodiment, the first period determining circuit was configured by the first oscillator circuit and the first frequency divider circuit while the second period determining circuit was configured by the second oscillator circuit and the second frequency divider circuit. However, where a desired oscillation period is available, the period determining circuit may be configured only with an oscillator circuit without connecting a frequency divider circuit. Namely, where the manufacture variation of temperature-dependent resistance elements is less and there is no need to adjust the oscillation period by adjusting means, the first period determining circuit can be configured only by a first oscillator circuit. Meanwhile, because the temperature-nondependent resistance element is basically less in manufacture variation, it is often the case that a second period determining circuit can be configured only by a second oscillator circuit without the need for adjusting means. In this manner, the first and second frequency divider circuits are suitably provided depending upon the manufacturing variation degree of the temperature-dependent and temperature-nondependent resistance elements. Where a frequency divider circuit is not provided on each period determining circuit, each oscillator circuit is connected directly to the logic gate (NAND circuit, in the third embodiment). Even on the oscillation-period determining device, because there is no variation in the temperature-dependent resistance element, it is possible to obtain a temperature characteristic of oscillation period similar to that of the third embodiment.

The oscillator circuit of the third embodiment is considered greater in consumption power because of two oscillator circuits as compared to the oscillator circuit of the first embodiment. However, because power consumption is mainly due to charging/discharging the capacitor of the oscillator circuit and switching of the frequency divider circuit, consumption power decreases as oscillation period increases. Of the two oscillator circuits, the oscillator circuit longer in oscillation period consumes not so much power. Meanwhile, where a frequency divider circuit is added to a temperature-nondependent oscillator circuit, there is no need for a spare temperature-nondependent resistance element, hence reducing the occupation area of resistance element.

In the above embodiments, the CMOS inverter was shown on the example that the transistor series circuit including NMOS and PMOS transistors is directly connected between the power voltage terminal and the reference voltage terminal. However, this invention is not limited to such configuration, i.e. connection may be made between the power voltage terminal and the PMOS transistor through another active or passive circuit or element. For example, connection may be through a MOS transistor, a resistance element or the like. Namely, unless preventing against achieving the object of the invention, connection may be through another element or circuit. Likewise, another active or passive circuit or element is connected between the resistance parallel circuit of the delay circuit and the output node. For example, another active or passive circuit or element may be connected between the resistance parallel circuit of the delay circuit and the output node.

[Manufacturing Method for a Temperature-dependent Resistance Element]

Explanation is now made on a method for manufacturing a resistance element dependent upon temperature to be used in the present invention. Incidentally, in FIGS. 16A–16C, 17A and 17B, 18, 19, 20A and 20B, 21A and 21B, 22A–22C and 23A and 23B, the size, shape and positional relationship of constituent elements is mere schematic showing to a degree for understanding the manufacturing example. Meanwhile, the use material, film thickness, implant energy and other numerical conditions mentioned below are mere one examples within the scope of the manufacturing example. In the figures, the like constituent elements are attached with the same numerals, and the duplicated explanation thereof may be omitted. The hatching representative of a section and the like is shown partly omitted.

<First Manufacturing Example of Temperature-dependent Resistance Element>

This manufacturing example explains a method of forming a temperature-dependent resistance element 318a on a second interlayer insulation film 316.

FIGS. 16A to 16C and FIGS. 17A and 17B are views explaining a first manufacturing process, illustrating by sectional view the sample forms upon the main processes of forming a resistance element during a manufacturing process for a semiconductor integrated circuit. Note that showing is in the state having formed a first interlayer insulation film 300, wherein the semiconductor substrate and the like are omitted.

FIG. 16 shows a state having formed a capacitor 314 on the first interlayer insulation film 300, wherein the semiconductor substrate and the like are omitted.

The capacitor 314 has an interconnect layer 304 formed in a through-hole 302 formed in the first interlayer insulation film 300, and a conductor layer 306 formed on the first interlayer insulation film and contacted with the interconnect layer 304. The interconnect layer 304 and the conductor layer 306 form a storage node (lower electrode) 308. The conductor layer 306 has a surface, on the side not contacted with the conductor layer 306, covered by a capacitor insulation film 310. A cell plate (upper electrode) 312 is formed over the capacitor insulation film 310. In this manner, the capacitor 314 is constructed by the storage node 308, the capacitor insulation film 310 and the cell plate 312.

Then, a second interlayer insulation film 316 is formed. The second interlayer insulation film is suitably selected depending upon the ion-implanting impurity to a polysilicon film to be formed in the next process. In this manufacturing example, because boron, e.g. $BF_2$, is implanted, a BPSG (borophosphosilicate glass) is formed overlying a non-doped oxide film not to diffuse the ion-implanted impurity into the second interlayer insulation film. Meanwhile, where P (phosphorus) is ion-implanted, the use of a BPSG film on the second interlayer insulation film allows phosphorus to diffuse into the ion-implanted polysilicon, resulting in a concentration change. Accordingly, a non-doped oxide film or nitride film is formed.

Figure 16A:
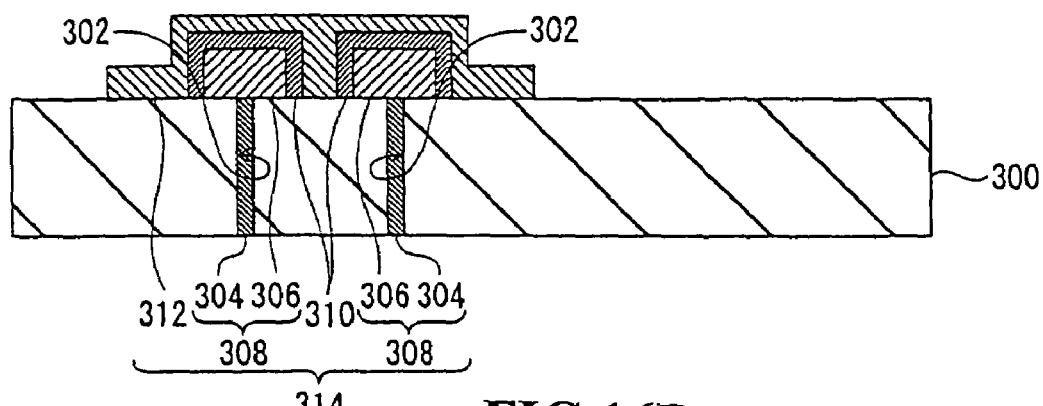
FIGS. 16A–16C are processing views in a first manufacturing example for a temperature-dependent resistance element.
Figure 16B:
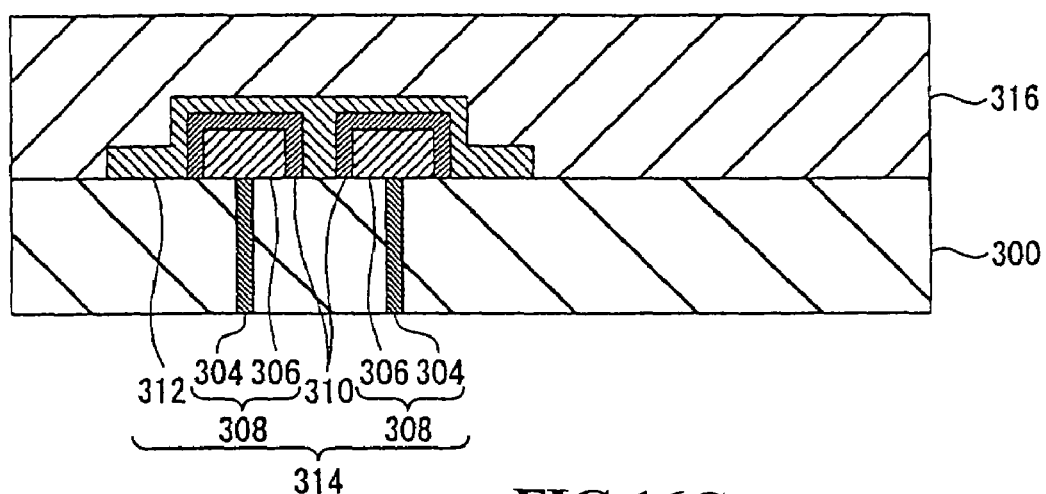

The formed second interlayer insulation film 316 is planarized by CMP (Chemical Mechanical Polish) or etching-back, for example (FIG. 16B).

Figure 16C:
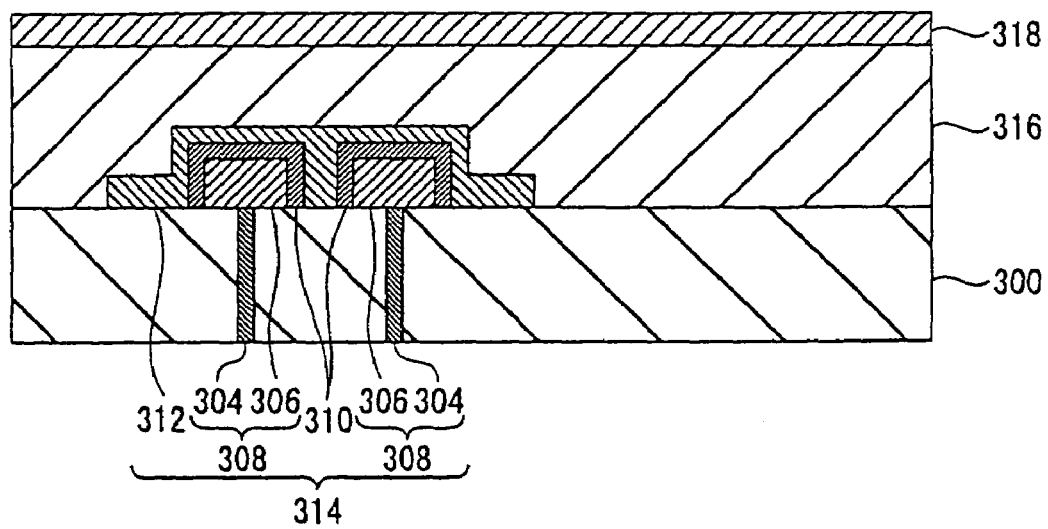

Next, a non-doped polysilicon film 318 is formed in a thickness of 50–400 nm by the CVD process, for example (FIG. 16C). $BF_2$, for example, is ion-implanted to the polysilicon film 318, with an energy of 20–80 keV and at a dose of 1E13–1E14 $cm^{-2}$.

Although $BF_2$ was described as an example of ion-implant impurity, this is not limitative but another P-type impurity may be used. Alternatively, an N-type impurity is also applicable. As an N-type impurity, it is possible to consider an example that P (phosphorus) is ion-implanted with an energy of 20–80 keV and at a dose of 1E13–5E14 $cm^{-2}$.

Figure 17A:
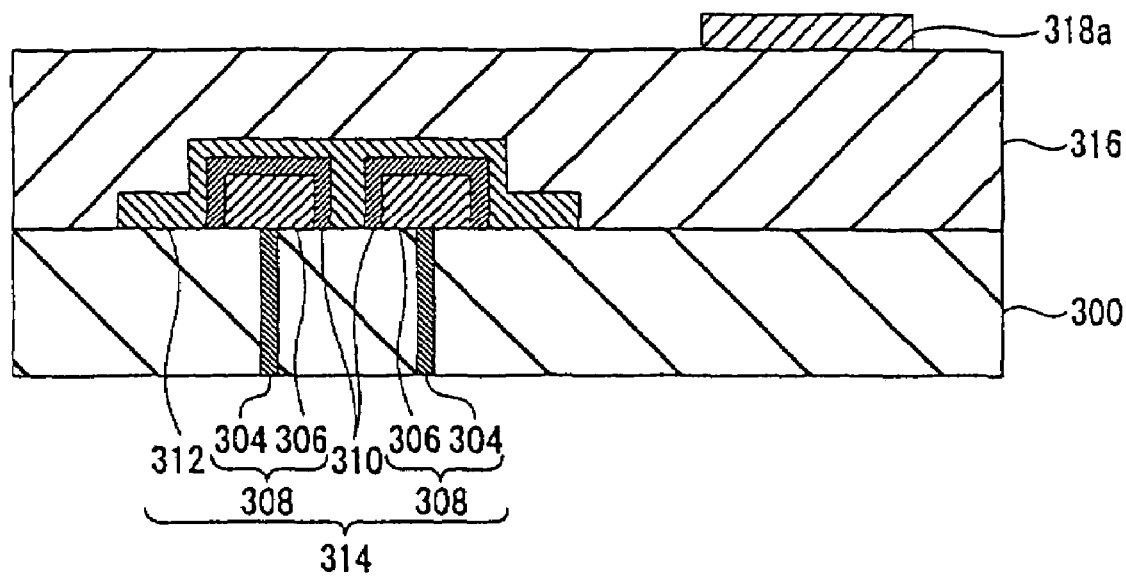
FIGS. 17A and 17B are processing views in the first manufacturing example for a temperature-dependent resistance element, continued from FIG. 16C.

Patterning is carried out by known photolithography etching (FIG. 17A). At this time, the patterned region of the polysilicon film is made into a resistance element having a resistance value changing with temperature, i.e. temperature-dependent resistance element 318a.

Thereafter, a third interlayer insulation film 320 is formed. The third interlayer insulation film 320 is formed by a BPSG film, similarly to the second interlayer insulation film. In the case of ion implanting to the polysilicon film 318 by P (phosphorus), a non-doped oxide or nitride film is preferably formed.

Figure 17B:
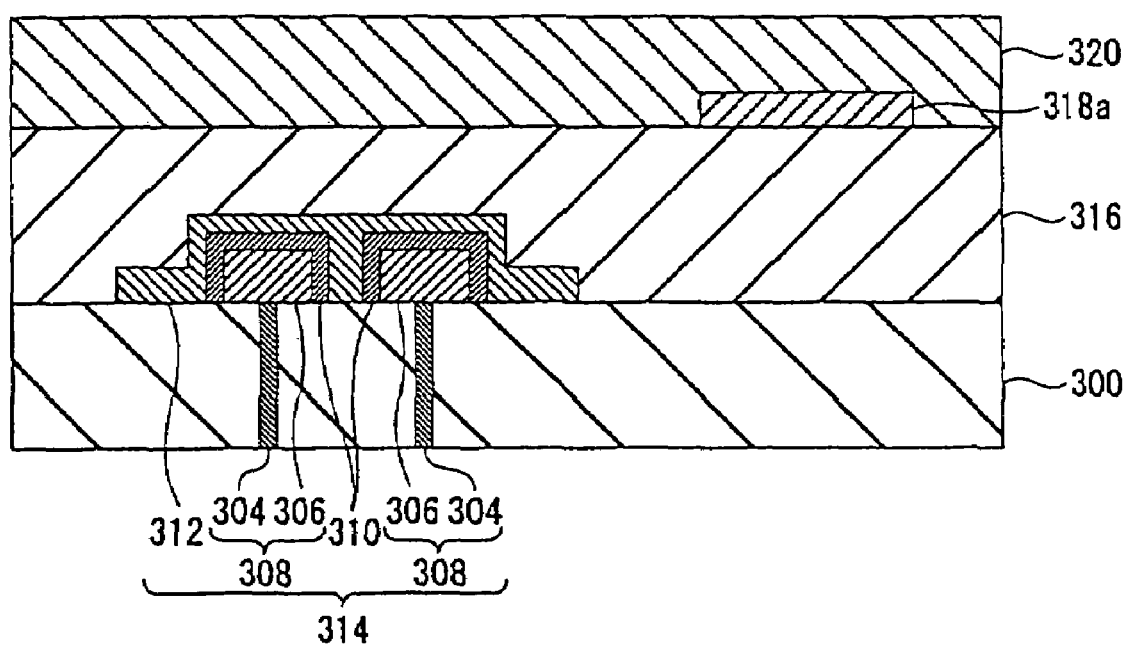
Figure 18:
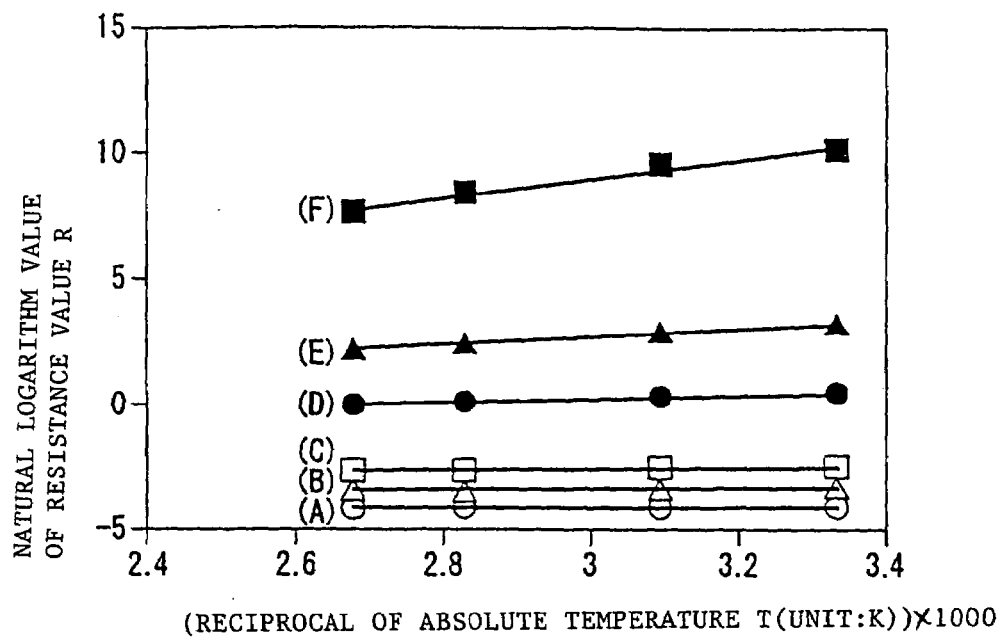
FIG. 18 is a figure representing a temperature characteristic of resistance value of the temperature-dependent resistance element.

The formed third interlayer insulation film 320 is subjected to an anneal process at 750–950° C. for approximately 10 to 60 minutes (usually, preferably for 15 to 30 minutes). Then, planarization is made by CMP or etching-back (FIG. 17B).

Thereafter, photolithography etching is conducted to open a contact hole, to form an interconnect layer metal by sputtering or CVD process. Subsequently, patterning is made by photolithography etching, to form an interconnect layer connecting to the temperature-dependent resistance element (showing omitted).

In this manner, a temperature-dependent resistance element 318a is formed by an impurity-implanted polysilicon film on the second interlayer insulation film.

FIGS. 18A and 18B are graphs showing the relationship between a resistance value and a temperature of the resistance element.

The vertical axis represents a natural logarithm value of sheet resistance value (unit: MΩ). The horizontal axis denotes a reciprocal of an absolute temperature T (unit: K), showing graduations on 1/1000 scale. For example, because absolute temperature is 323K at 50° C., 1/T is approximately $3.1 \times 10^{-3}$. Herein, sheet resistance value represents a resistance value of a 1-$\mu$m square resistor.

The lines (A)–(F) each represent a sheet-resistance change against temperature at each dose of $BF_2$ to the polysilicon film. The dose of $BF_2$ is (A): 1E15, (B): 5E14, (C): 3E14, (D): 1E14, (E): 5E13 and (F): 1E13. On (A)–(C), there is no substantial change in sheet resistance value when the temperature is changed. The graph is of a straight line parallel with the horizontal axis. Namely, there is almost no change of resistance value against temperature. Meanwhile, sheet resistance value is approximately (A): 0.15 MΩ, (B): 0.035 MΩ, and (C): 0.082 MΩ. Thus, the resistance values are quite small. On (D), sheet resistance value is approximately 1.0 MΩ at nearly 100° C. (2.68 on the horizontal graduations) and approximately 1.3 MΩ at nearly 30° C. (3.33 on the horizontal graduations), thus assuming nearly a straight line increasing toward the right. On (E), sheet resistance value is approximately 8.3 MΩ at nearly 100° C. (2.68 on the horizontal graduations) and approximately 24 MΩ at nearly 30° C. (3.33 on the horizontal graduations), thus assuming nearly a straight line increasing toward the right. On (F), sheet resistance value is approximately 1670 MΩ at nearly 100° C. (2.68 on the horizontal graduations) and approximately 3470 MΩ at nearly 30° C. (3.33 on the horizontal graduations), thus assuming nearly a straight line increasing in the right. On the graphs of (D) to (F), when 1/T is small or absolute temperature T is high, sheet resistance value is small. When 1/T is great or absolute temperature T is low, sheet resistance value is great. Meanwhile, line inclination increases in the order of (D), (E) and (F). Meanwhile, the sheet resistance value at each temperature increases with decreasing dose. Although not shown on the graph, in case the dose of $BF_2$ is further decreased, the resistance value at each temperature increases exceeding the measurement range herein, resulting in increase of resistance-value increasing rate, i.e. line inclination. Furthermore, because impurity dope variation also increases, a desired resistance value is difficult to obtain.

From this fact, it can be understood that, in the range of $BF_2$ dose of 1E13–1E14 into polysilicon film, the resistance element has a sheet resistance value decreasing with increasing temperature and increasing with decreasing temperature, i.e. temperature-dependent resistance element. Meanwhile, by adjusting the dope, obtained is a resistance element having a desired resistance value dependent upon temperature.

Figure 19:
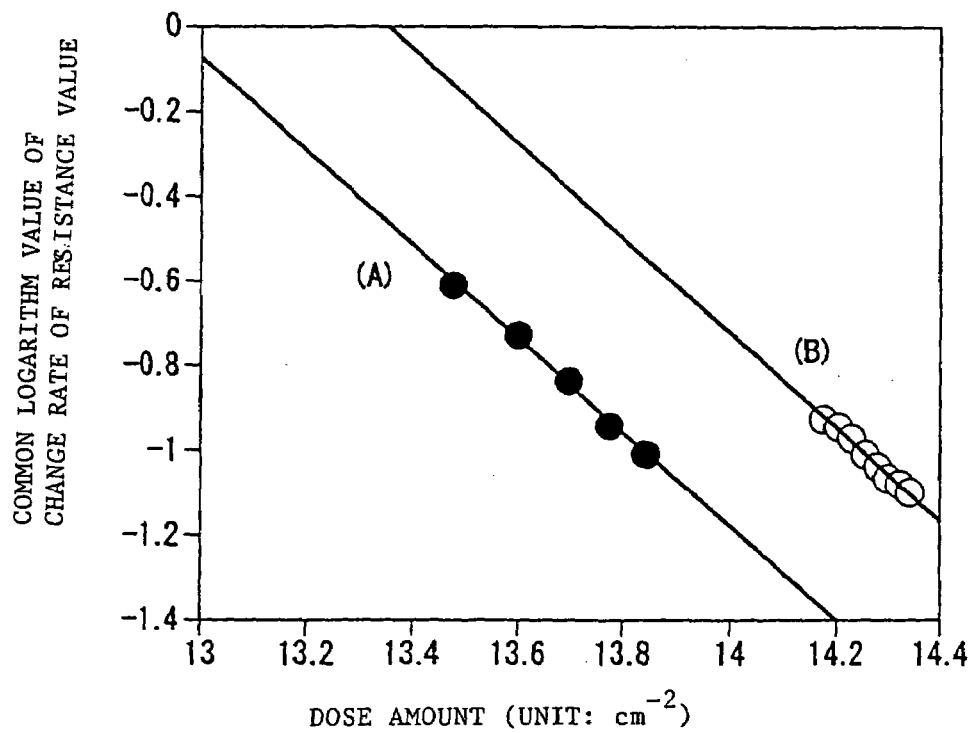
FIG. 19 is a figure of a correlation between impurity dose and resistance-value change rate.

FIG. 19 is a graph representing a relationship between a sheet resistance value gradient against temperature and a dose.

The sheet resistance value gradient against temperature is the change rate of sheet resistance value (unit: MΩ) against temperature (unit: K). The common logarithm value of the change rate is taken on the vertical axis of the FIG. 19 graph. The horizontal axis denotes a dose (unit: $cm^{-2}$).

The graph (A) is for a case that $BF_2$ is ion implanted at 50 keV into a polysilicon film while the graph (B) is for a case that P (phosphorus) is ion implanted at 40 keV into polysilicon. In both the cases of $BF_2$ and P, the change rate of resistance value decreases with increasing dose, wherein the inclination shows nearly a straight line.

From this fact, it can be seen that, by previously preparing a correlation chart of a resistance-value change rate of each impurity and a dose, a temperature-dependent resistance element having a desired gradient against temperature can be obtained by adjusting the dose.

<Second Manufacturing Example of Temperature-dependent Resistance Element>

This manufacturing example explains a method of forming a cell plate 322a and simultaneously a temperature-dependent resistance element 322b, on the first interlayer insulation film 300.

FIGS. 20A and 20B and FIGS. 21A and 21B are views on a second manufacturing process. This illustrates by sectional views the sample forms in the main processes of forming a resistance element during a manufacturing process for a semiconductor integrated circuit. Note that showing is in the state having formed the first interlayer insulation film 300, wherein the semiconductor substrate and the like are omitted.

Figure 20A:
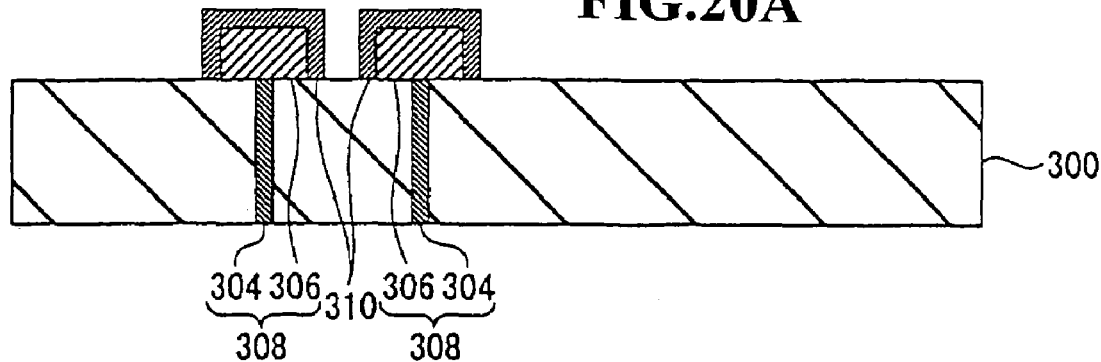
FIGS. 20A and 20B are processing views in a second manufacturing example for a temperature-dependent resistance element.
Figure 20B:
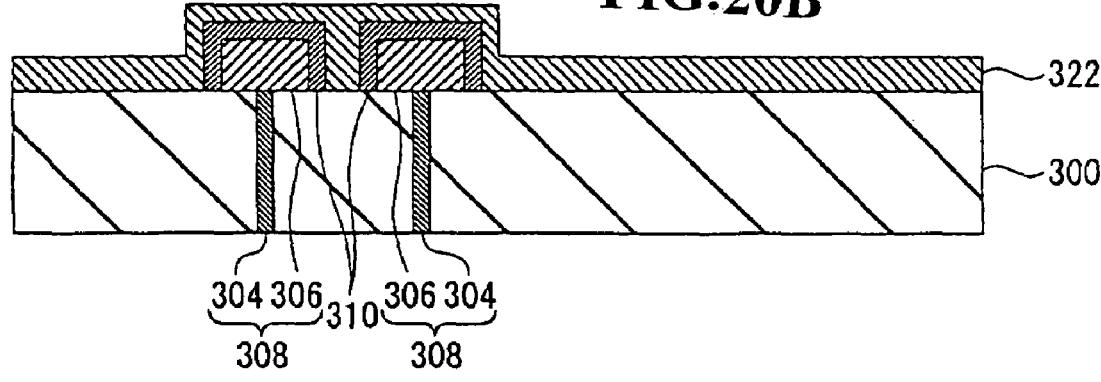

FIG. 20A shows a stage prior to depositing a cell plate of FIG. 16A. Over the underlying layer, a non-doped polysilicon film 322 is formed to a thickness of 50–400 nm by a CVD process. Thereafter, an impurity is implanted to the polysilicon film 322. For example, $BF_2$ is ion-implanted with an energy of 20–80 keV and a dose of 1E13–1E14 $cm^{-2}$ (FIG. 20B). This impurity is not limited to $BF_2$ but may be another P-type or N-type impurity, as was noted in the first manufacturing example of temperature-dependent resistance element.

Figure 21A:
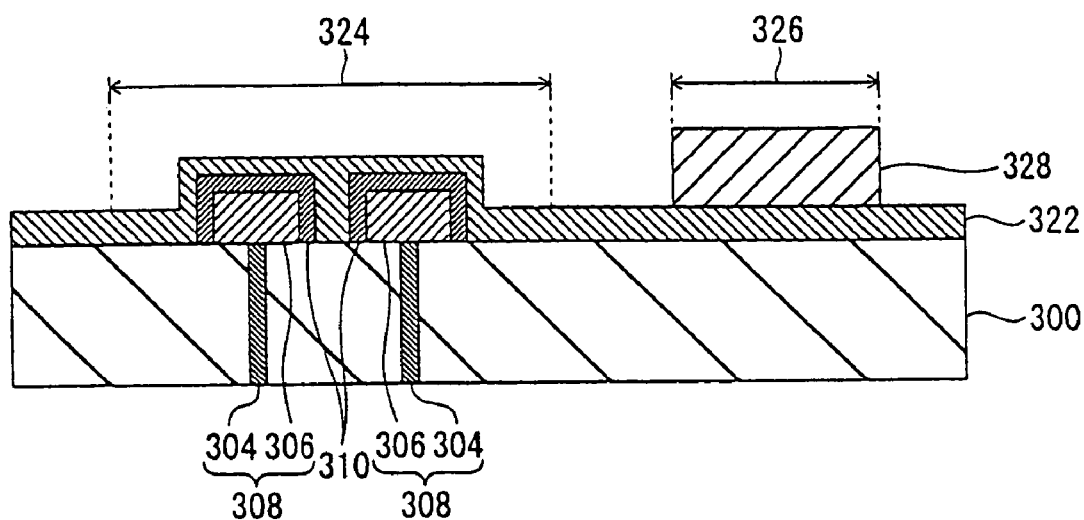
FIGS. 21A and 21B are processing views in the second manufacturing example for a temperature-dependent resistance element, continued from FIG. 20B.
Figure 21B:
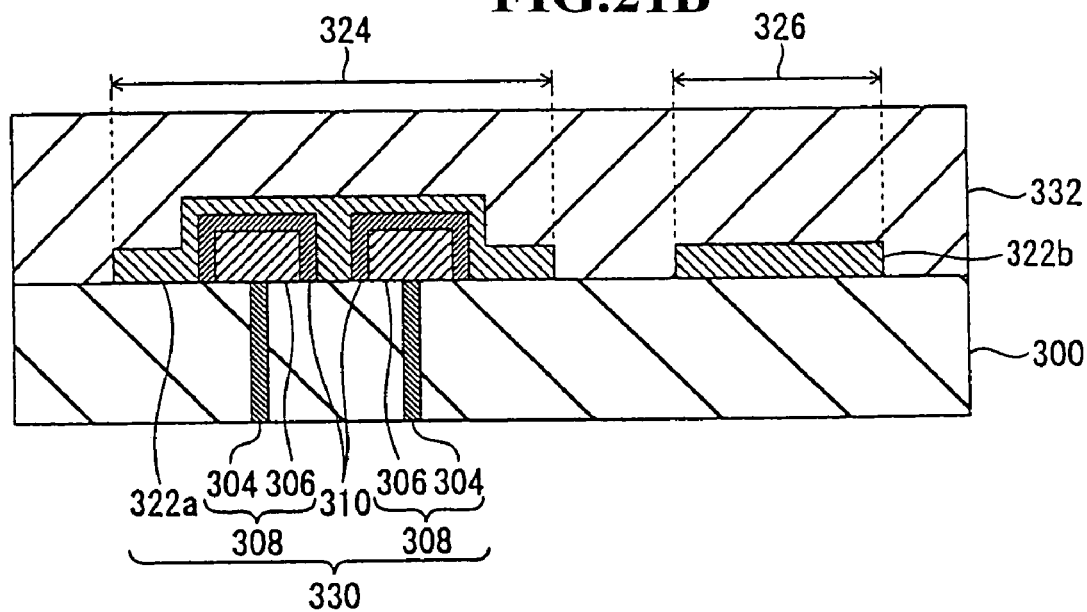

Then, the polysilicon film 322 in a region to be made into a resistance element, i.e. resistant element forming region 326, is protected by resist 328. $BF_2$ is ion-implanted further to a region to be made into a cell plate, i.e. region including a capacitor forming region 324, with an energy of 20–80 keV and a dose of 1E15–1E16 $cm^{-2}$ (FIG. 21A). After removing the resist 328, patterning is made by the known photolithography etching technique. This patterning forms a temperature-dependent resistance element 322b and a cell plate 322a (FIG. 21B). A second interlayer insulation film 332 is formed by a BPSG film, thereby forming a temperature-dependent resistance element 332b on the same layer as the capacitor 330. In this manner, although forming a temperature-dependent resistance element increases by one process of ion implantation, the patterning by photolithography etching allows for simultaneous forming a cell plate and a temperature-dependent resistance element, thereby reducing the total number of processes.

<Third Manufacturing Example of Temperature-dependent Resistance Element>

This manufacturing example explains a method of forming a cell plate 322a and simultaneously a temperature-dependent resistance element 322b and temperature-nondependent resistance element 322c, on the first interlayer insulation film 300.

FIGS. 22A to 22C and FIGS. 23A and 23B are views on a third manufacturing process. This illustrates by sectional views the sample forms in the main processes of forming a resistance element during a manufacturing process for a semiconductor integrated circuit. Note that showing is in the state having formed the first interlayer insulation film 300, wherein the semiconductor substrate and the like are omitted.

FIG. 22A shows a stage prior to depositing a cell plate of FIG. 16A. Over the underlying layer, a non-doped polysilicon film 322 is formed to a thickness of 50–400 nm by a CVD process. Thereafter, an impurity is implanted to the polysilicon film 322. For example, $BF_2$ is ion-implanted with an energy of 20–80 keV and a dose of 1E13–1E14 $cm^{-2}$ (FIG. 22B). This impurity is not limited to $BF_2$ but may be another P-type or N-type impurity, as was noted in the first manufacturing example of temperature-dependent resistance element.

Figure 23A:
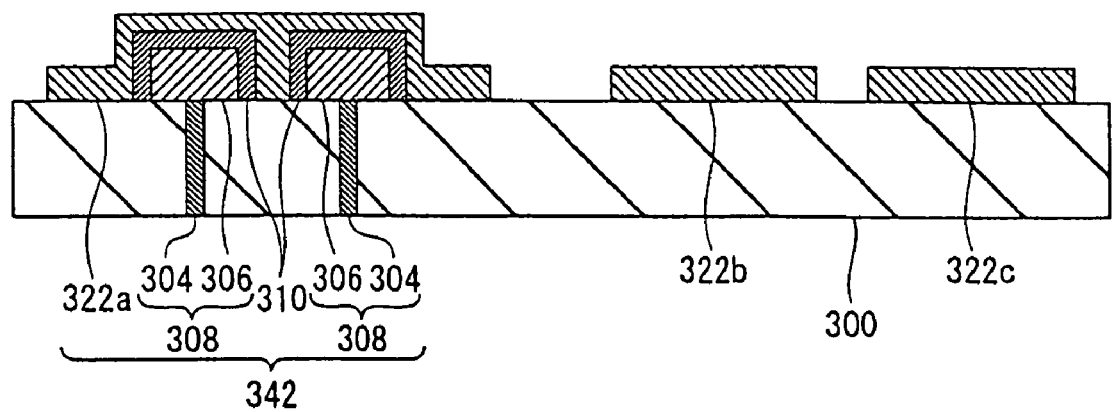
FIGS. 23A and 23B are processing views in the third manufacturing example for a temperature-dependent resistance element, continued from FIG. 22C.
Figure 23B:
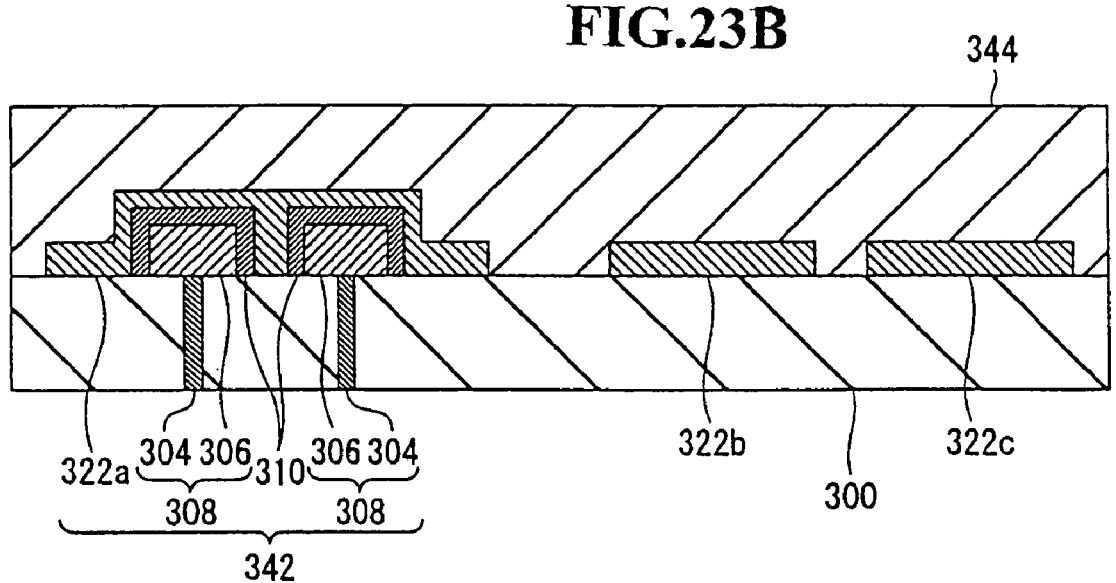

Then, the polysilicon film 322 in a region to be made into a resistance element, i.e. resistant element forming region 336, is protected by resist 340. $BF_2$ is ion-implanted further to a region to be made into a cell plate, i.e. region including a capacitor forming region 334 and a temperature-nondependent resistance element forming region 338, with an energy of 20–80 keV and a dose of 1E15–1E16 $cm^{-2}$ (FIG. 22C). After removing the resist 340, patterning is made by the known photolithography etching technique. This patterning forms a temperature-dependent resistance element 322b, a cell plate 322a and a temperature-nondependent resistance element 322c (FIG. 23A). A second interlayer insulation film 344 is formed by a BPSG film, thereby forming a temperature-dependent resistance element 322b and temperature-nondependent resistance element 322c on the same layer as the capacitor 342 (FIG. 23B). In this manner, although forming a temperature-dependent resistance element increases by one process of ion implantation, the patterning by photolithography etching allows for simultaneous forming a cell plate and a temperature-dependent resistance element and temperature-nondependent resistance element, thus reducing the total number of processes.

By forming an oscillator circuit using a temperature-dependent resistance element within a semiconductor integrated circuit according to the above method, oscillation period varies depending upon the internal temperature of the integrated circuit. Accordingly, in case this is used for a refresh period in a DRAM self-refresh mode, it is possible to obtain an oscillation period suited for the internal temperature of the semiconductor integrated circuit.

Therefore, the use of the foregoing manufacturing example for a temperature-dependent resistance element makes it possible to suitably form a temperature-dependent resistance element used in the invention, on a semiconductor integrated circuit.

According to the oscillator circuit configured by a semiconductor integrated circuit of a first feature of the invention, at high temperature, output is an output signal of oscillation period as determined much affected by the temperature-dependent resistance element. At low temperature, output is an output signal of oscillation period as determined much affected by the temperature-nondependent resistance element. In the oscillator circuit of the invention, oscillation period is shorter as temperature is higher and longer as temperature is lower. Meanwhile, the oscillator circuit of the invention has a temperature characteristic that, although oscillation period increases with lower temperature, as temperature is lower the change rate of oscillation period decreases and converges to a maximum value.

According to the oscillator circuit configured by a semiconductor integrated circuit of a second feature of the invention, at high temperature, output is a signal of oscillation period as determined much affected by the temperature-dependent resistance element. At low temperature, output is a signal of oscillation period as determined affected by the temperature-nondependent resistance element. In the oscillator circuit of the invention, oscillation period is shorter as temperature is higher in a high temperature region. In a low temperature region, there is no change of oscillation period with temperature wherein a constant maximum value is taken that is determined by the temperature-nondependent resistance element.

According to the oscillator circuit configured by a semiconductor integrated circuit of a third feature of the invention, at high temperature, output is a signal of oscillation period of a first oscillation period determining circuit as determined affected by the temperature-dependent resistance element. At low temperature, output is a signal of oscillation period of a second oscillation period determining circuit as determined affected by the temperature-nondependent resistance element. In the oscillation period determining device of the invention, oscillation period is shorter as temperature is higher in a high temperature region. In a low temperature region, there is no change of oscillation period with temperature wherein a constant maximum value is taken that is determined by the temperature-nondependent resistance element.

In this manner, in case the oscillation period on the output signal of the semiconductor integrated circuit is used for a refresh period in a DRAM self-refresh mode, the maximum period can be placed under control. This can prevent memory test time from increasing while decreasing refresh current as temperature is lower. In addition, because the memory cells to be replaced with redundant cells can be decreased in the number, yield can be improved.

This application is based on Japanese Patent Application No. 2003-173003 which is herein incorporated by reference.

What is claimed is:

1. A semiconductor integrated circuit having a plurality of CMOS inverters connected in an odd number of stages and a ring oscillator circuit for feeding a final-stage output signal of a final-stage CMOS inverter back to an input end of a first-stage CMOS inverter thereby causing self-oscillation, the semiconductor integrated circuit wherein:
the first-stage CMOS inverter comprises
a transistor series circuit including PMOS and NMOS transistors connected between a power voltage terminal and a reference voltage terminal, and
a delay circuit for delaying a first-stage output signal of the first-stage CMOS inverter; and
the delay circuit comprises
a capacitor coupled between an output node of the first-stage CMOS inverter and the reference voltage terminal, and
a resistance parallel circuit inserted and coupled on a current passage of the transistor series circuit at between the output node and the reference voltage terminal;
the resistance parallel circuit being configured by a parallel connection of a plurality of resistance elements different in resistance-value temperature characteristic.

2. A semiconductor integrated circuit according to claim 1, wherein the plurality of resistance elements different in resistance-value temperature characteristic are a first resistance element having a resistance value decreasing with increasing temperature and a second resistance element having a resistance value nondependent upon temperature.

3. A semiconductor integrated circuit having a plurality of CMOS inverters connected in an odd number of stages and a ring oscillator circuit for feeding a final-stage output signal of a final-stage CMOS inverter back to an input end of a first-stage CMOS inverter thereby causing self-oscillation, the semiconductor integrated circuit comprising:
the first-stage CMOS inverter having first and second sub-CMOS inverters to which the final-stage output signal is to be fed back;
a second-stage CMOS inverter being configured by a logic gate having first and second input terminals to which first and second first-stage output signals of the first and second sub-CMOS inverters are to be respectively supplied;
the first sub-CMOS inverter having a first transistor series circuit including a first PMOS transistor and first NMOS transistor coupled between a power voltage terminal and a reference voltage terminal, and a first delay circuit for delaying the first-stage output signal;
the second sub-CMOS inverter having a second transistor series circuit including a second PMOS transistor and second NMOS transistor coupled between the power voltage terminal and the reference voltage terminal, and a second delay circuit for delaying the second-stage output signal;
the first delay circuit having a first capacitor coupled between a first output node of the first sub-CMOS inverter and the reference voltage terminal and a first resistance element inserted and coupled on a current passage of the first transistor series circuit at between the first output node and the reference voltage terminal and having a resistance value decreasing with increasing temperature; and
the second delay circuit having a second capacitor coupled between a second output node of the second sub-CMOS inverter and the reference voltage terminal and a second resistance element inserted and coupled on a current passage of the second transistor series circuit at between the second output node and the reference voltage terminal and having a resistance value nondependent upon temperature.

4. A semiconductor integrated circuit, comprising:
an oscillation period determining device including first and second oscillation period determining circuits, to output as a final output an output signal shorter in oscillation period of two output signals outputted by the two oscillation period determining circuits;

the first oscillation period determining circuit having a first oscillator circuit;

the first oscillator circuit having a plurality of CMOS inverters connected in an odd number of stages, so that an output signal of a final-stage CMOS inverter can be fed back to an input end of a first-stage CMOS inverter thereby causing self-oscillation;

the first-stage CMOS inverter having a first transistor series circuit including a first PMOS transistor and first NMOS transistor coupled between a power voltage terminal and a reference voltage terminal, and a first delay circuit for delaying the first-stage output signal of the first-stage CMOS inverter;

the first delay circuit having a first capacitor coupled between a first output node of a first sub-CMOS inverter and the reference voltage terminal and a first resistance element inserted and coupled on a current passage of the first transistor series circuit at between the first output node and the reference voltage terminal and having a resistance value decreasing with increasing temperature; and the second oscillation period determining circuit outputting an output signal having an oscillation period nondependent upon temperature.

5. A semiconductor integrated circuit according to claim 4, wherein the first oscillation period determining circuit has a first frequency divider circuit for dividing a frequency of an output signal of the first oscillator circuit to adjust an oscillation period, the first frequency divider circuit having an adjuster for changing a frequency dividing period in order to divide a frequency of an output signal of the first oscillator circuit.

6. A semiconductor integrated circuit according to claim 4 or 5, wherein the second oscillation period determining circuit is configured by a second oscillator circuit and a second frequency divider circuit; the second oscillator circuit having a plurality of CMOS inverters connected in an odd number of stages so that an output signal of the final-stage CMOS inverter can be fed back to an input end of the first-stage CMOS inverter thereby causing self-oscillation; the first-stage CMOS inverter of the second oscillator circuit having a second transistor series circuit including a second PMOS transistor and second NMOS transistor coupled between the power voltage terminal and the reference voltage terminal, and a second delay circuit for delaying a first-stage output signal of the first-stage CMOS inverter of the second oscillator circuit; the second delay circuit having a second capacitor coupled between a second output node of the second sub-CMOS inverter and the reference voltage terminal, and a second resistance element inserted and coupled on a current passage of the second transistor series circuit at between the second output node and the reference voltage terminal and having a resistance value nondependent upon temperature.

* * * * *